(12) United States Patent
Tanzawa

(10) Patent No.: US 9,082,485 B2
(45) Date of Patent: Jul. 14, 2015

(54) APPARATUSES AND METHODS INCLUDING MEMORY ARRAY AND DATA LINE ARCHITECTURE

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/089,337

(22) Filed: Nov. 25, 2013

(65) Prior Publication Data

US 2014/0078827 A1 Mar. 20, 2014

Related U.S. Application Data

(63) Continuation of application No. 13/192,248, filed on Jul. 27, 2011, now Pat. No. 8,593,869.

(51) Int. Cl.
| | |
|---|---|
| G11C 16/00 | (2006.01) |
| G11C 16/04 | (2006.01) |
| G11C 5/06 | (2006.01) |
| H01L 27/105 | (2006.01) |
| H01L 27/115 | (2006.01) |
| G11C 16/10 | (2006.01) |
| G11C 5/02 | (2006.01) |

(52) U.S. Cl.
CPC ............. *G11C 16/0483* (2013.01); *G11C 5/025* (2013.01); *G11C 5/06* (2013.01); *G11C 16/107* (2013.01); *H01L 27/1052* (2013.01); *H01L 27/11529* (2013.01); *H01L 27/11551* (2013.01); *H01L 27/11556* (2013.01); *H01L 27/11573* (2013.01); *H01L 27/11578* (2013.01); *H01L 27/11582* (2013.01); *G11C 2213/71* (2013.01)

(58) Field of Classification Search
CPC ........ G11C 16/107; G11C 5/06; G11C 5/025; G11C 7/18; G11C 16/0483; G11C 2213/07; H01L 27/1052; H01L 27/11529; H01L 27/11551; H01L 27/11556; H01L 27/11573; H01L 27/11578; H01L 27/11582
USPC ................... 365/185.05, 51, 63, 130, 185.18, 365/230.03
See application file for complete search history.

(56) References Cited

U.S. PATENT DOCUMENTS

| | | | |
|---|---|---|---|
| 5,206,183 | A | 4/1993 | Dennison |
| 5,345,563 | A | 9/1994 | Uihlein et al. |
| 5,828,621 | A | 10/1998 | Tanzawa et al. |
| 6,118,696 | A | 9/2000 | Choi |
| 6,551,857 | B2 | 4/2003 | Leedy |

(Continued)

OTHER PUBLICATIONS

Cernea, Raul, et al., "A 34MB/s-Program-Throughput 16Gb MLC NAND with All-Bitline Architecture in 56nm", ISSCC Session 23.1, Non-Volatile Memory, (Feb. 2008), 420-421, 624.

(Continued)

*Primary Examiner* — Tan T. Nguyen
(74) *Attorney, Agent, or Firm* — Schwegman Lundberg & Woessner, P.A.

(57) ABSTRACT

Some embodiments include apparatus and methods having memory cells located in different device levels of a device, at least a portion of a transistor located in a substrate of the device, and a data line coupled to the transistor and the memory cells. The data line can be located between the transistor and the memory cells. Other embodiments including additional apparatus and methods are described.

22 Claims, 30 Drawing Sheets

(56) References Cited

U.S. PATENT DOCUMENTS

| | | | |
|---|---|---|---|
| 6,594,168 | B2 | 7/2003 | Keeth et al. |
| 6,643,159 | B2 | 11/2003 | Fricke et al. |
| 6,747,305 | B2 | 6/2004 | Forbes et al. |
| 7,606,059 | B2 * | 10/2009 | Toda .............................. 365/148 |
| 7,821,865 | B2 * | 10/2010 | Choi et al. ............... 365/230.03 |
| 8,097,504 | B2 | 1/2012 | Mokhlesi et al. |
| 8,116,149 | B2 * | 2/2012 | Chen et al. ............... 365/189.15 |
| 8,278,170 | B2 | 10/2012 | Lee et al. |
| 8,383,482 | B2 | 2/2013 | Kim et al. |
| 8,395,190 | B2 | 3/2013 | Shim et al. |
| 8,593,869 | B2 * | 11/2013 | Tanzawa .................. 365/185.17 |
| 8,780,631 | B2 | 7/2014 | Tanzawa |
| 8,792,263 | B2 | 7/2014 | Tanzawa |
| 2010/0012997 | A1 | 1/2010 | Jang et al. |
| 2010/0271885 | A1 | 10/2010 | Scheuerlein et al. |
| 2011/0002178 | A1 | 1/2011 | Hwang et al. |
| 2011/0115010 | A1 | 5/2011 | Shim et al. |
| 2011/0205776 | A1 | 8/2011 | Murata |
| 2012/0003828 | A1 | 1/2012 | Chang et al. |
| 2012/0047321 | A1 | 2/2012 | Yoon et al. |
| 2012/0051137 | A1 | 3/2012 | Hung et al. |
| 2012/0068259 | A1 | 3/2012 | Park et al. |
| 2012/0147651 | A1 | 6/2012 | Scheuerlein et al. |
| 2012/0182804 | A1 | 7/2012 | Hung et al. |
| 2013/0028023 | A1 | 1/2013 | Tanzawa |
| 2013/0028024 | A1 | 1/2013 | Tanzawa |
| 2013/0148427 | A1 | 6/2013 | Lee |
| 2013/0163305 | A1 | 6/2013 | Tanzawa |
| 2014/0056049 | A1 | 2/2014 | Tanzawa |
| 2014/0321188 | A1 | 10/2014 | Tanzawa |
| 2014/0334219 | A1 | 11/2014 | Tanzawa |

OTHER PUBLICATIONS

Chiang, M H, "Novel High-Density Low-Power Logic Circuit Techniques Using DG Devices", IEEE ED, 52(10), (Oct. 2005), 2339-42.

Crowley, Matthew, et al., "512 Mb PROM with 8 Layers of Antifuse/Diode Cells", IEEE International Solid-State Circuits Conference 2003 Digest of Papers, (Feb. 11, 2003), 284-293.

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a Three-Dimensional Array of Diode/Antifuse Memory Cells", IEEE Journal of Solid-State Circuits, vol. 38, No. 11, (Nov. 2003), 1920-1928.

Katsumata, R, et al., "Pipe-shaped BiCS flash memory with 16 stacked layers and multi-level-cell operation for ultra high density storage devices", Symposium on VLSI Technology, (Jun. 2009), 136-37.

Kim, J, et al., "Novel Vertical-Stacked Array-Transistor (VSAT) for ultra-high-density and cost-effective NAND Flash memory devices and SSD (Solid State Drive)", Symposium on VLSI Technology, (2009), pp. 186-187.

Kim, W, et al., "Multi-layered Vertical Gate NAND Flash overcoming stacking limit for terabit density storage", Symposium on VLSI Technology, (Jun. 2009), 188-89.

Sakui, K, et al., "Design Impacts on NAND Flash Memory Core Circuits with Vertical MOSFETs", IEEE International Memory Workshop (IMW), (May 2010), 4 pgs.

Tanaka, T., et al., "A quick intelligent page-programming architecture and a shielded bitline sensing method for 3 V-only NAND flash memory", IEEE Journal of Solid-State Circuits, 29(11), (Nov. 1994), 1366-1373.

Tanzawa, T., et al., "Circuit techniques for a 1.8-V-only NAND flash memory", IEEE Journal of Solid-State Circuits, 37(1), (Jan. 2002), 84-89.

\* cited by examiner

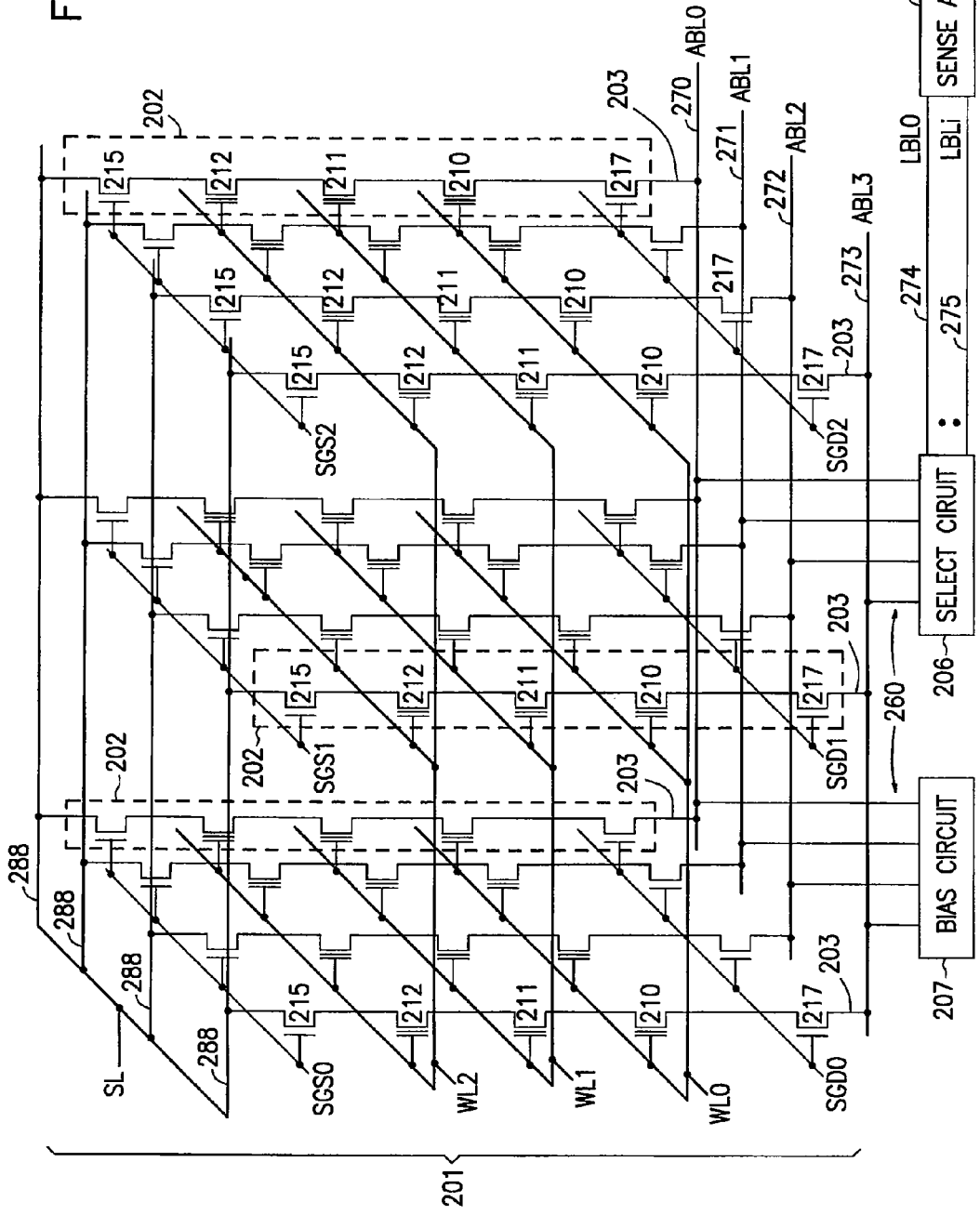

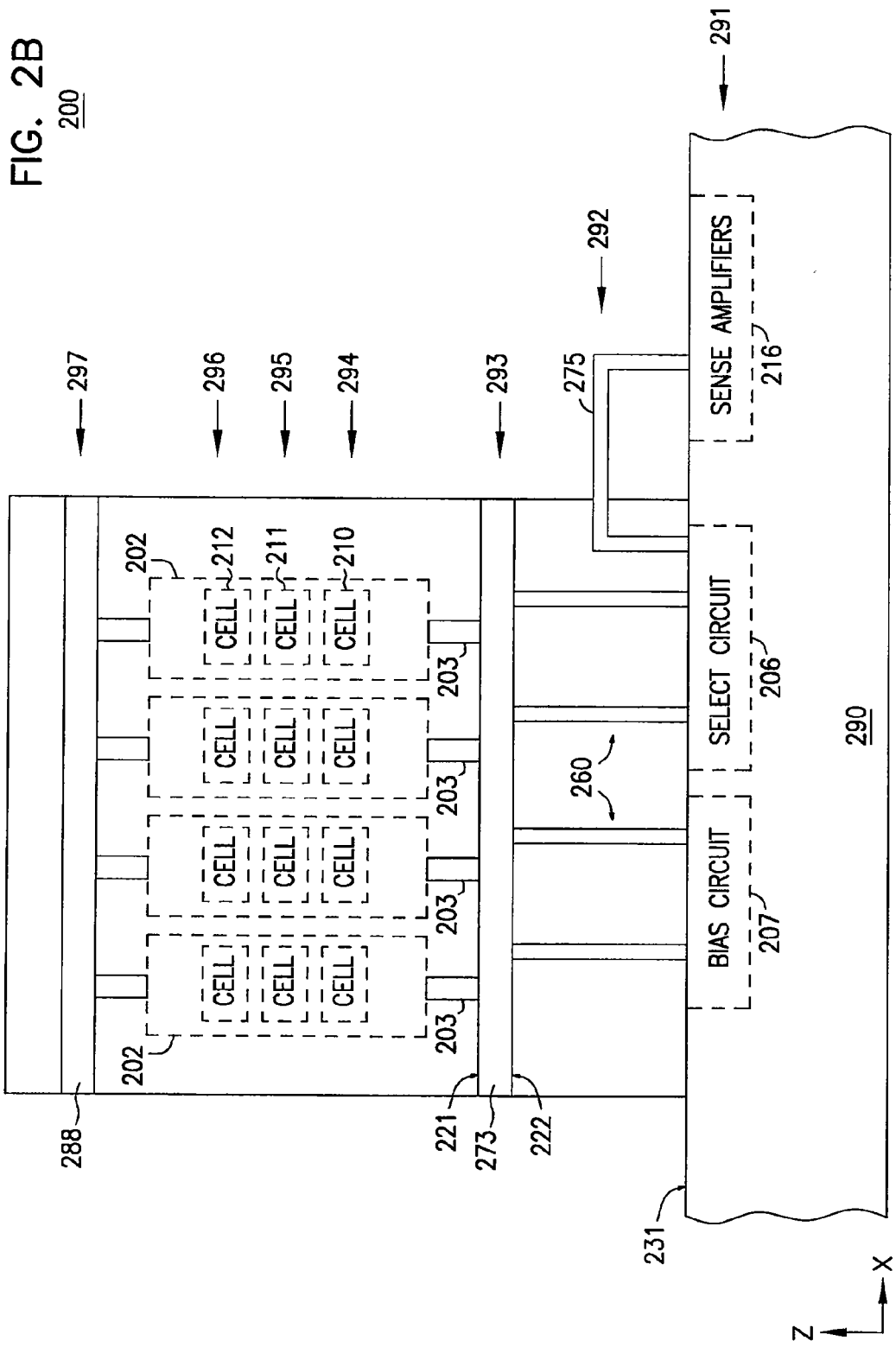

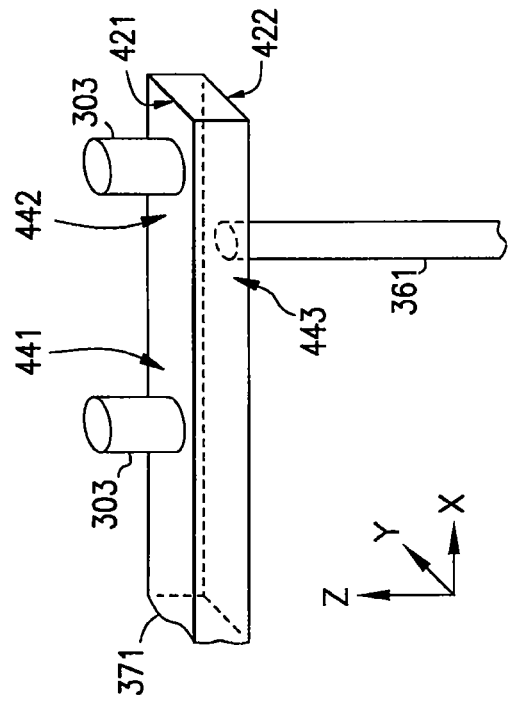
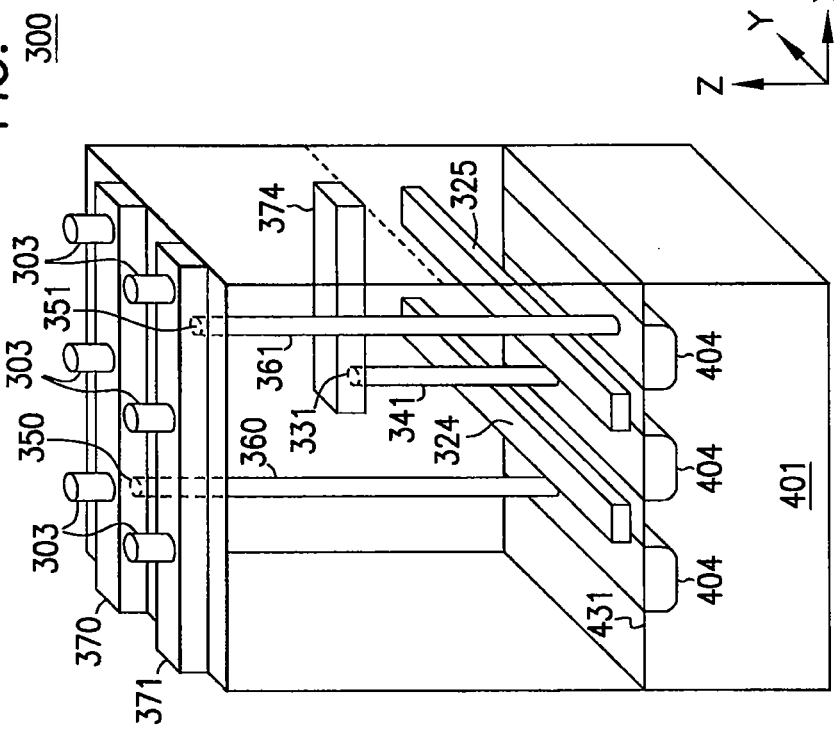

300

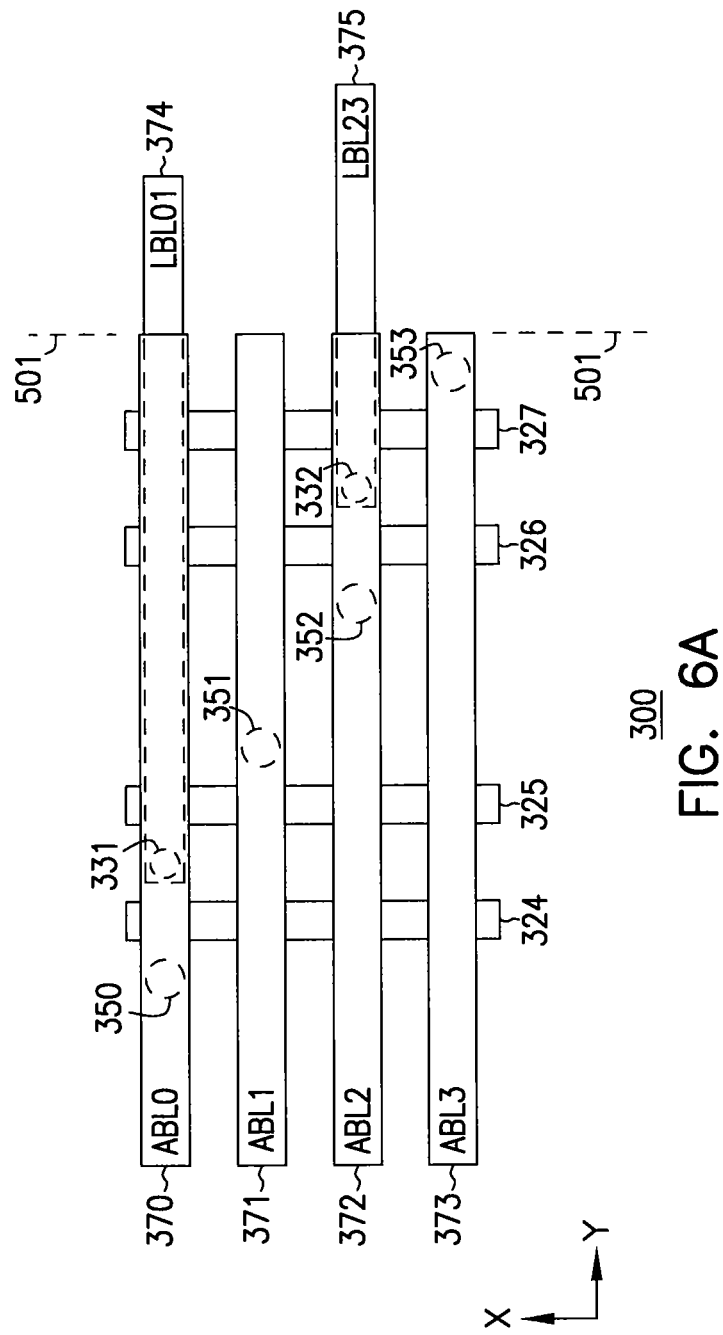

700

777

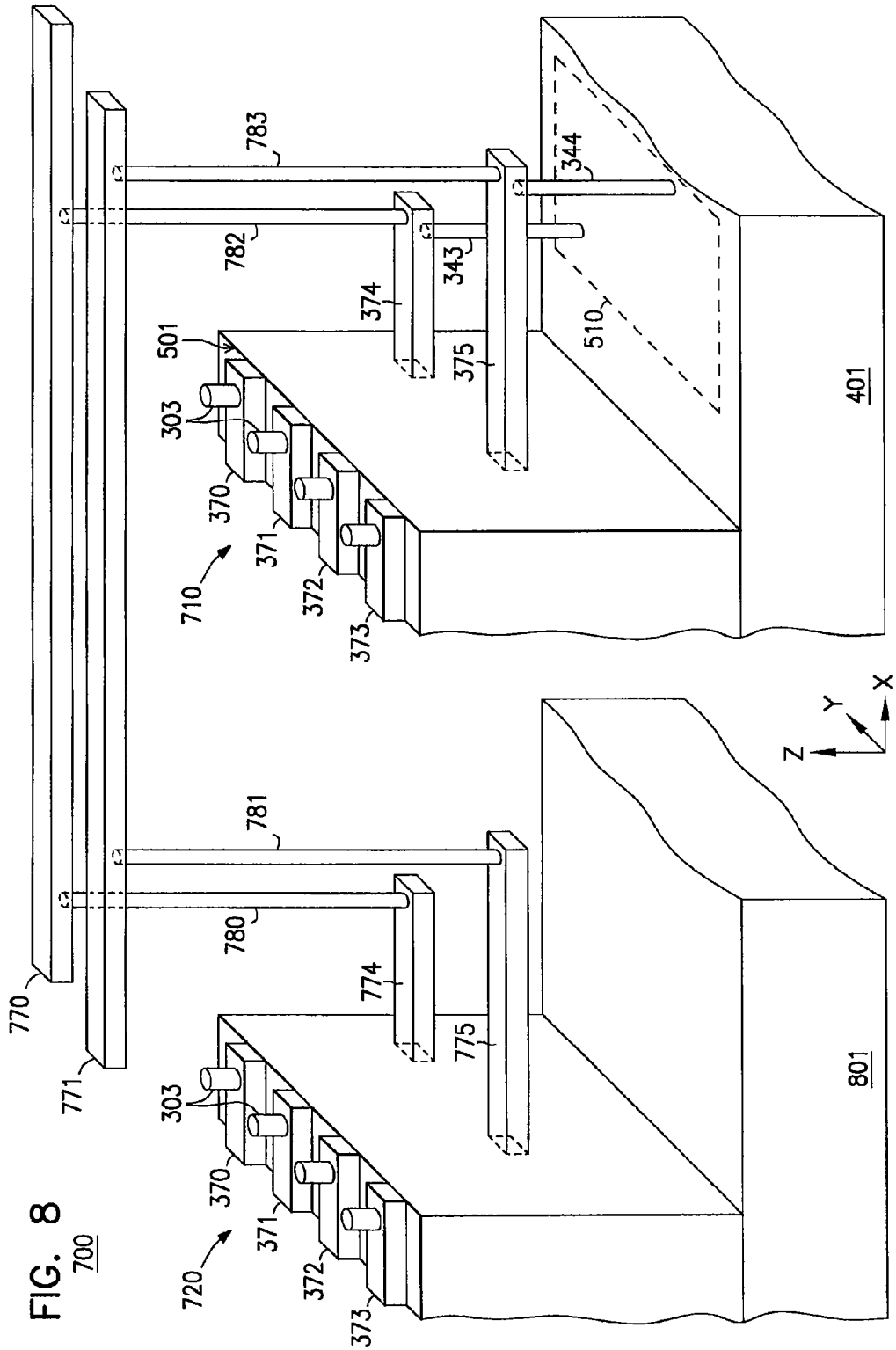

900

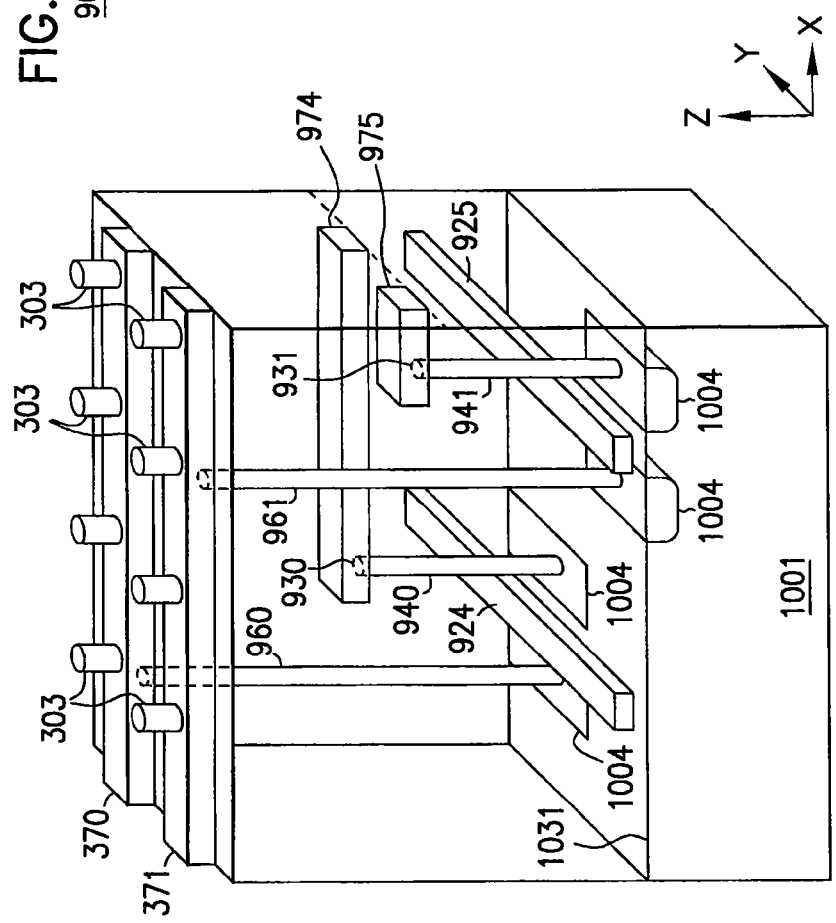

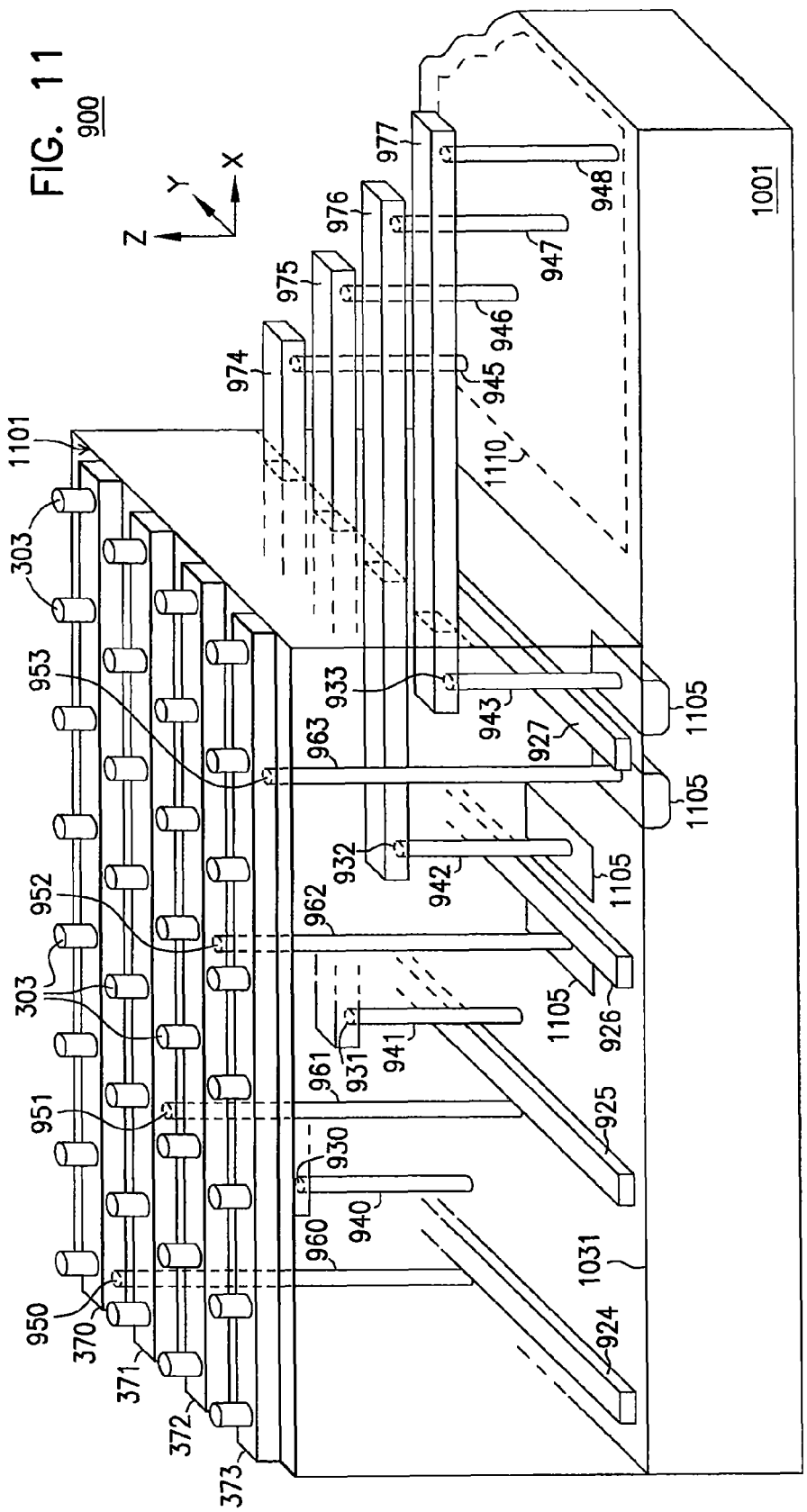

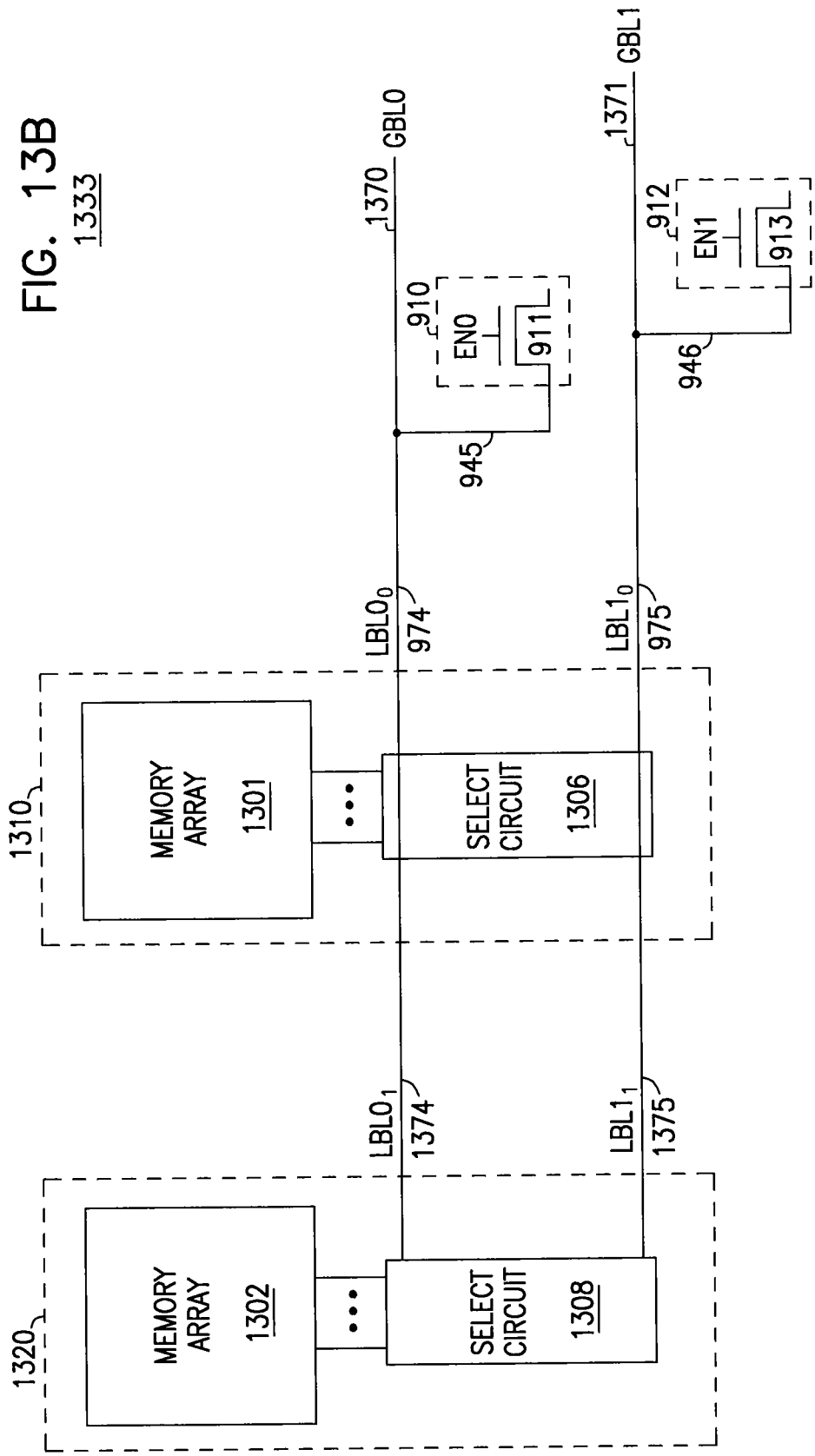

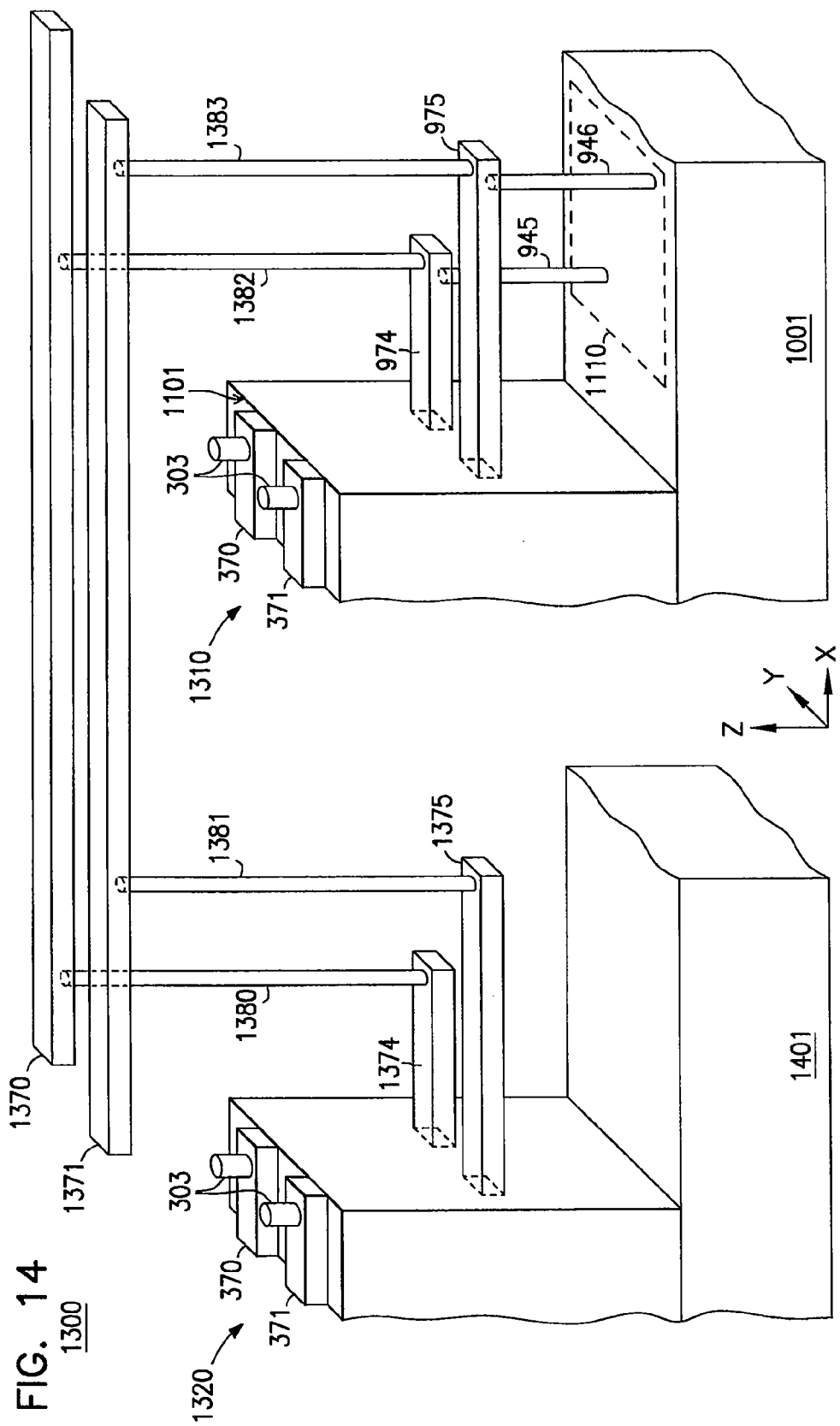

1500

1500

1800

APPARATUSES AND METHODS INCLUDING MEMORY ARRAY AND DATA LINE ARCHITECTURE

PRIORITY APPLICATION

This application is a continuation of U.S. application Ser. No. 13/192,248, filed Jul. 27, 2011, now issued as U.S. Pat. No. 8,593,869, which is incorporated herein by reference in its entirety.

BACKGROUND

Memory devices, such as flash memory, are widely used in computers and many electronic products. Such memory devices usually have a memory array with numerous memory cells to store information. These memory devices also have circuitry and interconnections associated with the memory array. As memory cell density increases for a given device size, designing circuitry and interconnections associated with a memory array in these devices may pose a challenge.

BRIEF DESCRIPTION OF THE DRAWINGS

FIG. 2A shows a schematic diagram of a portion of a memory device having a memory array, data lines, a select circuit, and a bias circuit, according to an embodiment of the invention.

FIG. 2B show a side view of a structure of a portion of the memory device of FIG. 2A, according to an embodiment of the invention.

FIG. 4A shows a three-dimensional (3-D) view of a structure of a portion of the memory device of FIG. 3, according to an embodiment of the invention.

FIG. 4B shows some detail of a data line of FIG. 4A, according to an embodiment of the invention.

FIG. 6A shows a top view of the structure of the portion of the memory device of FIG. 5, according to an embodiment of the invention.

FIG. 8 shows a 3-D view of a structure of the portion of the memory device of FIG. 7A, according to an embodiment of the invention.

FIG. 10 shows a 3-D view of a structure of a portion of the memory device of FIG. 9, according to an embodiment of the invention.

FIG. 11 shows additional components of the structure of the portion of the memory device of FIG. 10, according to an embodiment of the invention.

FIG. 13B shows a schematic diagram of a portion of a memory device including local data lines arranged to form global data lines, according to an embodiment of the invention.

FIG. 14 shows a 3-D view of a structure of the portion of the memory device of FIG. 13A, according to an embodiment of the invention.

DETAILED DESCRIPTION

Figure 1:
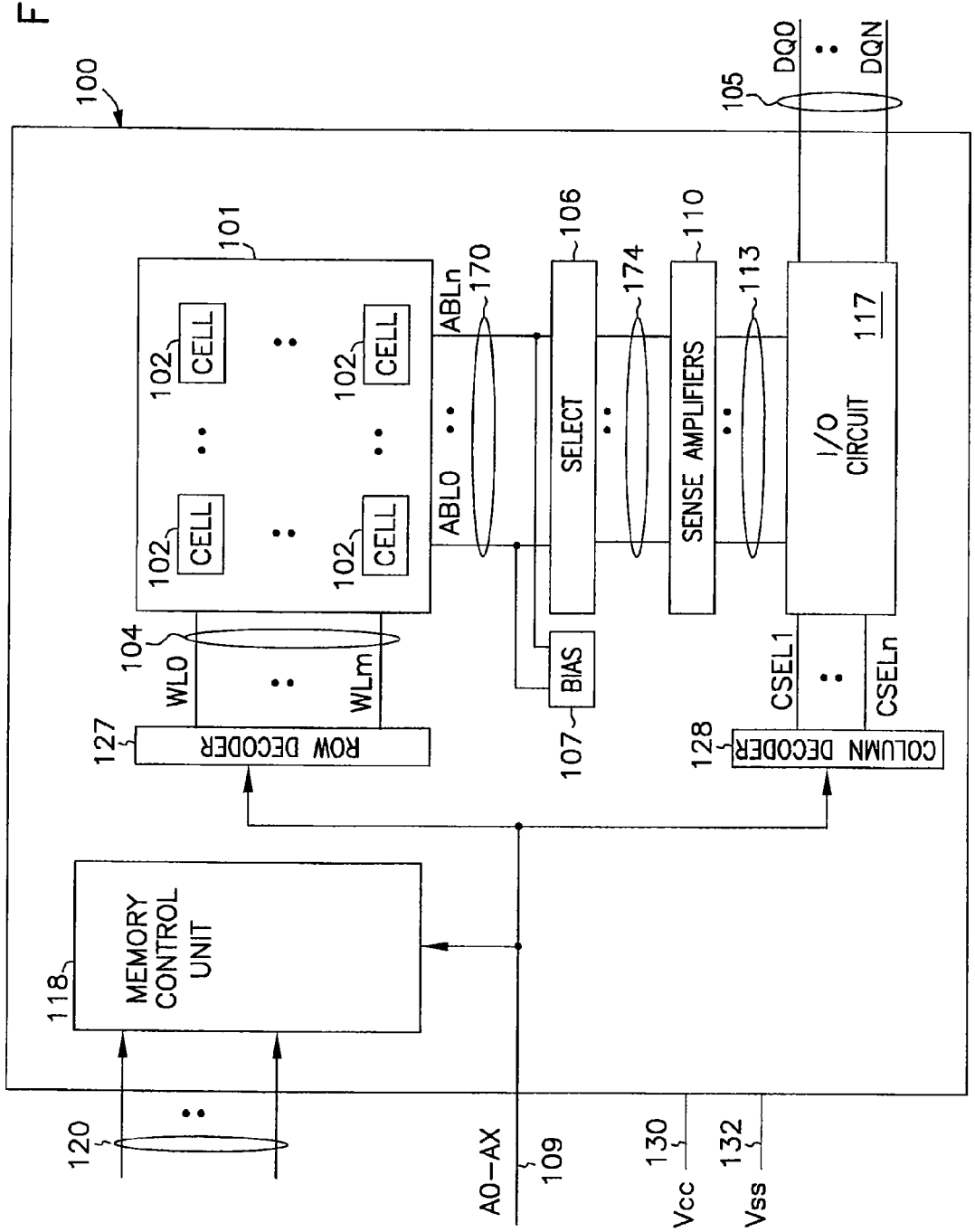
FIG. 1 shows a block diagram of a memory device having a memory array and memory cells, according to an embodiment of the invention.

FIG. 1 shows a block diagram of an apparatus in the form of a memory device 100 having a memory array 101 with memory cells 102, according to an embodiment of the invention. Memory cells 102 can be arranged in rows and columns along with lines 104 and lines 170. Lines 104 can carry signals WL0 through WLm and can form part of access (e.g., word) lines of memory device 100. Lines 170 can carry signals ABL0 through ABLn and can form part of array data lines (e.g., bit lines) of memory device 100.

Memory device 100 may use lines 104 to access memory cells 102 and lines 170 to exchange information (e.g., provide signals) with memory cells 102. A row decoder 127 and a column decoder 128 decode address signals A0 through AX on lines 109 (e.g., address lines) to determine which memory cells 102 are to be accessed in a memory operation.

Memory device 100 can perform memory operations such as a read operation to read information from memory cells 102 and a write (e.g., programming) operation to write (e.g., program) information into memory cells 102. Memory device 100 can also perform an erase operation to clear information from some or all of memory cells 102.

A memory control unit 118 controls memory operations of memory device 100 based on control signals on lines 120. Examples of the control signals on lines 120 include one or more clock signals and other signals to indicate which operation (e.g., read, programming, or erase operation) memory device 100 can perform.

Other devices external to memory device 100 (e.g., a memory access device, such as a processor or a memory controller) can control the values of the control signals on lines 120. Specific values of a combination of the signals on lines 120 can produce a command (e.g., read, programming, or erase command) that can cause memory device 100 to perform a corresponding memory operation (e.g., read, programming, or erase operation).

Memory device 100 can include a select circuit 106 that is configured to selectively couple lines 170 associated with memory cells 102 to sense amplifiers 110 through lines 174 in a memory operation, such as a read operation.

Memory device 100 can include a bias circuit 107 that is configured to selectively couple lines 170 to different voltages in different memory operations (e.g., read and programming operations).

Examples of select circuit 106 and bias circuit 107 are described below with reference to FIG. 2A through FIG. 26.

Sense circuitry, such as sense amplifiers 110 in FIG. 1, is configured to determine the value of information from memory cells 102 in a memory operation, such as a read operation, and provides the information in the form of signals to lines 113 (e.g., data lines). Sense amplifiers 110 can also use the signals on lines 113 to determine the value of information to be written (e.g., programmed) into memory cells 102.

Memory device 100 can include an input/output (I/O) circuit 117 to exchange information between memory array 101 and lines (e.g., data lines) 105. I/O circuit 117 can respond to signals CSEL1 through CSELn to select the signals on lines 113 that can represent the information read from or programmed into memory cells 102. Column decoder 128 can selectively activate the CSEL1 through CSELn signals based on the A0 through AX address signals on lines 109. I/O circuit 117 can select the signals on lines 113 to exchange information between memory array 101 and lines 105 during read and programming operations.

Signals DQ0 through DQN on lines 105 can represent information read from or to be written into memory cells 102. Lines 105 can include nodes within memory device 100 or pins (or solder balls) on a package where memory device 100 can reside. Other devices external to memory device 100 (e.g., a memory controller or a processor) can communicate with memory device 100 through lines 105, 109, and 120.

Each of memory cells 102 can be programmed to store information representing a value of a fraction of a bit, a value of a single bit or a value of multiple bits such as two, three, four, or another number of bits. For example, each of memory cells 102 can be programmed to store information representing a binary value "0" or "1" of a single bit. The single bit per cell is sometimes called a single level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a non-volatile memory device and memory cells 102 can include non-volatile memory cells, such that memory cells 102 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 102 can be physically located in multiple levels on the same device, such that some of memory cells 102 can be stacked over some other memory cells 102 in multiple levels over a substrate (e.g., a semiconductor substrate) of memory device 100.

One of ordinary skill in the art may recognize that memory device 100 may include other elements, several of which are not shown in FIG. 1, so as not to obscure the embodiments described herein.

Memory device 100 may include memory devices and operate using memory operations (e.g., read, programming, and erase operations) similar to or identical to memory devices and operations described below with reference to FIG. 2A through FIG. 26.

FIG. 2A shows a schematic diagram of a portion of a memory device 200 having a memory array 201, lines 270, 271, 272, and 273, a select circuit 206, and a bias circuit 207, according to an embodiment of the invention. Memory device 200 can be associated with memory device 100 of FIG. 1, such as forming a portion of memory array 101, lines 170, select circuit 106, and bias circuit 107, respectively, of memory device 100.

Lines 270, 271, 272, and 273 can be structured as conductive lines and can form part of array data lines (e.g., bit lines) of memory device 200 to carry signals ABL0, ABL1, ABL2, and ABL3, respectively. Lines 288 can be structured as a conductive line and can form part of a source line of memory device 200 that carries signal SL.

Memory device 200 can include memory cell strings 202 coupled to line 288. Memory cell strings 202 are also coupled to lines 270, 271, 272, and 273 at connections 203. Each of memory cell strings 202 can include memory cells 210, 211, and 212, and transistors 215 and 217.

FIG. 2A shows four lines 270, 271, 272, and 273 and three memory cells 210, 211, and 212 in each of three memory cell strings 202 as an example. The number of lines, the number of memory cells in each memory cell string, and the number of memory cell strings may vary.

Memory device 200 can include control gates, which can carry associated signals WL0, WL1, and WL2, and can form at least part of access lines. As shown in FIG. 2A, memory cells in different memory cell strings can share the same control gate (e.g., the same physical control gate). For example, memory cells 210 can share the control gate associated with signal WL0. Memory cells 211 can share the control gate associated with signal WL1. Memory cells 212 can share the control gate associated with signal WL2. Each of the control gates associated with signal WL0, WL1, or WL2 can be structured a single control gate located in a single device level of memory device 200.

Memory device 200 can include lines (e.g., select lines) that can carry associated signals SGS0, SGS1, SGS2, SGD0, SGD1, and SGD2. As shown in FIG. 2A, the gates of transistors 215 from memory cell strings 202 coupled to different lines 270, 271, 272, and 273 can share one of the lines associated with signals SGS0, SGS1, and SGS2. The gates of transistors 217 from memory cell strings 202 coupled to different lines 270, 271, 272, and 273 can share one of the lines associated with signals SGD0, SGD1, and SGD2.

During a memory operation (e.g., a read or write operation), transistors 215 can respond to respective signals SGS0, SGS1, and SGS2 to couple selected memory cell strings 202 to line 288. Transistors 217 can respond to respective signals SGD0, SGD1, and SGD2 to couple selected memory cell strings 202 to lines 270, 271, 272, and 273.

Memory device 200 can use signals WL0, WL1, and WL2 to control access to memory cells 210, 211, and 212, respectively, such as to sense (e.g., read) information stored in memory cells 210, 211, and 212 during a read operation, or to store information into memory cells 210, 211, and 212 during a write operation. Memory device 200 can use lines 270, 271, 272, and 273 to provide the information read from memory cells 210, 211, and 212 during a read operation.

Select circuit 206 is configured to selectively couple lines 270, 271, 272, and 273 (e.g., array data lines) to lines 274 and 275 (e.g., local data lines). FIG. 2A shows two lines 274 and 275 as an example. The number of these lines may vary. Each of signals LBL0 and LBLi on lines 274 and 275, respectively, can correspond to one of signals ABL0, ABL1, ABL2, and ABL3. For example, when select circuit 206 couples line 270 to line 274, signal LBL0 on line 274 corresponds to (e.g., represents) signal ABL0 on line 270. In another example, when select circuit 206 couples line 271 to line 274, signal LBL0 on line 274 corresponds to (e.g., represents) signal ABL1 on line 271. In a further example, when select circuit 206 couples line 272 to line 275, signal LBLi on line 275 corresponds to (e.g., represents) signal ABL2 on line 272.

Sense amplifiers 216 of memory device 200 can sense signals LBL0 and LBLi to determine corresponding values of stored information from memory cell strings and provide the values (e.g., in the form of signals) to other components of memory device 200 (e.g., an I/O circuit, such as I/O circuit 117 of FIG. 1) for further processing.

Bias circuit 207 is configured to selectively couple lines 270, 271, 272, and 273 to different voltages in different memory operations (read and programming operations).

Select circuit 206, bias circuit 207, and sense amplifiers 216 can include select circuits, bias circuits, and sense amplifiers described below with reference to FIG. 3 through FIG. 26.

FIG. 2B show a side view of a structure of a portion of memory device 200 of FIG. 2A, according to an embodiment of the invention. As shown in FIG. 2B, memory device 200 can include a substrate 290, which can include a semiconductor substrate (e.g., a silicon substrate).

Memory device 200 can include device levels 291, 292, 293, 294, 295, 296, and 297 with respect to a Z-direction. As shown in FIG. 2B, components of memory device 200 can be located in different device levels. For example, at least a portion of each of select circuit 206, bias circuit 207, and sense amplifiers 216 can be located in (e.g., formed on or in) substrate 290 in device level 291. Memory cells 210, 211, and 212 of memory cell strings 202 can be located in device levels 294, 295, and 296, respectively, above levels 291, 292, and 293. Thus, as shown in FIG. 2B, memory cells 210, 211, and 212 in each of memory cell strings 202 can be stacked over each other in multiple levels of memory device 200 over substrate 290.

Line 273 can be located between memory cell strings 202 and each of select circuit 206 and bias circuit 207, such that memory cell strings 202 can be on one side 221 of line 273 and such that select circuit 206 and bias circuit 207 can be on another side 222 of line 273. Side 222 can be closer to a surface 231 of substrate 290 than side 221 (e.g., closer by a thickness of line 273). Line 273 has length in an X-direction, which is perpendicular (or substantially perpendicular) to the Z-direction.

As shown in FIG. 2B, each of lines 275 and 273 has a length in an X-direction, which is perpendicular (or substantially perpendicular) to the Z-direction. Line 273 can be located in device level 293, which is between device level 294 and surface 231 of substrate 290. Line 288 can be located in device level 297, which is above device levels 292 and 293 such that line 273 is between line 288 and line 275.

Lines 270, 271, and 272 (FIG. 2A) can have a structure similar to that of line 273 and can be located in the same device level 293 as line 273. Line 274 (FIG. 2A) can have a structure similar to that of line 275 and can be located in the same device level 292 as line 275.

FIG. 2A and FIG. 2B show an example arrangement and structure of memory cell strings 202 and associated connections. Memory cell strings 202 and associated connections can have a different arrangement and structure.

Memory device 200 may include memory devices and operate using memory operations (e.g., read, programming, and erase operations) similar to or identical to memory devices and operations described below with reference to FIG. 3 through FIG. 26. For example, select circuit 206, bias circuit 207, and sense amplifiers 216 of memory device 200 can include select circuits, bias circuits, and sense amplifiers described below with reference to FIG. 3 through FIG. 26.

Figure 3:
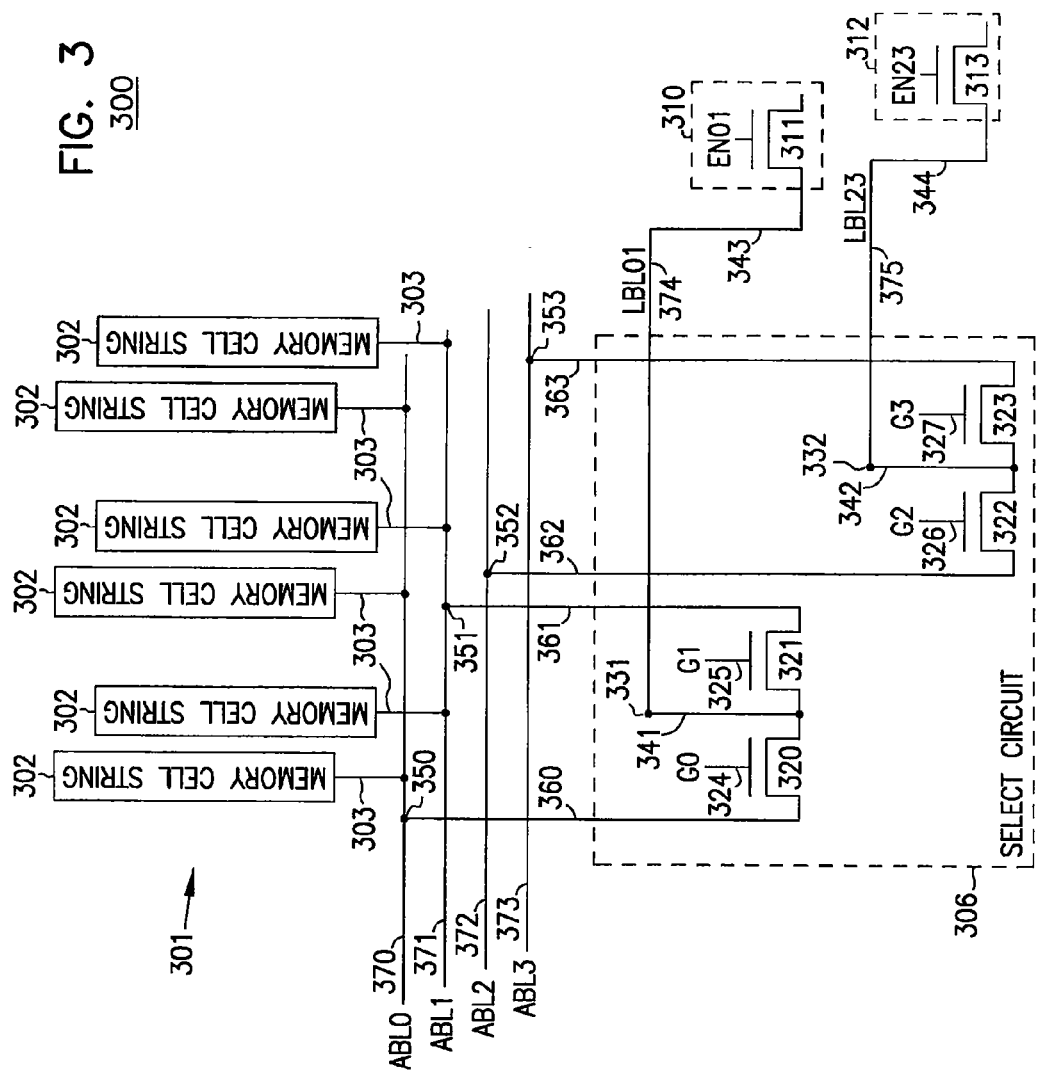
FIG. 3 shows a schematic diagram of a portion of a memory device including a memory array and a select circuit, according to an embodiment of the invention.

FIG. 3 shows a schematic diagram of a portion of a memory device 300 including a memory array 301 and a select circuit 306, according to an embodiment of the invention. Memory device 300 can be associated with memory device 100 of FIG. 1, such as forming a portion of memory array 101 and select circuit 106, respectively, of memory device 100.

As shown in FIG. 3, memory device 300 can include lines 370, 371, 372, and 373 located between memory cell strings 302 of memory array 301 and select circuit 306. Each of lines 370, 371, 372, and 373 has associated memory cell strings 302. For simplicity, FIG. 3 omits memory cell strings coupled to lines 372 and 373.

Each of memory cell strings 302 can include memory cells stacked over each other in multiple device levels of memory device 300 over a substrate (e.g., a semiconductor substrate) of memory device 300. For example, each of memory cell strings 302 can include memory cells with arrangement and structure similar to or identical to that of memory cells 210, 211, and 212 of FIG. 2A and FIG. 2B.

As shown in FIG. 3, memory cell strings 302 can be directly coupled to lines 370, 371, 372, and 373. Connections 303 represent parts of memory cell strings 302 that are directly coupled to lines 370, 371, 372, and 373.

Lines 370, 371, 372, and 373 can be structured as conductive lines and can form part of data lines (e.g., bit lines) of memory device 300 to carry signals ABL0, ABL1, ABL2, and ABL3, respectively. These signals can represent stored information (e.g., values of data bits) provided by memory cell strings 302 to respective lines 370, 371, 372, and 373 during a read operation of memory device 300.

Select circuit 306 can selectively couple lines 370, 371, 372, and 373 to lines 374 and 375 during a memory operation (e.g., a read operation). Signal LBL01 on line 374 can correspond to either a signal (e.g., ABL0) from line 370 or a signal (e.g., ABL1) from line 371. Signal LBL23 on line 375 can correspond to either a signal (e.g., ABL2) from line 372 or a signal (e.g., ABL3) from line 373.

Sense amplifiers 310 and 312 of memory device 300 are configured to sense signals LBL01 and LBL23. Sense amplifiers 310 and 312 can include a transistor 311 coupled to lines 343 and 374 and a transistor 313 coupled to lines 344 and 375. Transistors 311 and 313 can respond to corresponding signals EN01 and EN23 to enable sense amplifiers 310 and 312 to sense signals LBL01 and LBL23 and determine corresponding values of the stored information. Sense amplifiers 310 and 312 may provide the values (e.g., in the form of signals) to other components of memory device 300 (e.g., an I/O circuit, such as I/O circuit 117 of FIG. 1) for further processing.

As shown in FIG. 3, select circuit 306 can include transistors 320, 321, 322, and 323 having associated gates 324, 325, 326, and 327 and signals G0, G1, G2, and G3.

Transistors 320 and 321 can form a multiplexer having multiplexer inputs at nodes 350 and 351 and a multiplexer output at node 331. Nodes 331, 350, and 351 are coupled to lines 341, 360, and 361, respectively, which can be structured as conductive lines.

Transistors 322 and 323 can form a multiplexer having multiplexer inputs at nodes 352 and 353 and a multiplexer output at node 332. Nodes 332, 352, and 353 are coupled to lines 342, 362, and 363, respectively, which can be structured as conductive lines.

During a memory operation, transistors 320 and 321 can respond to corresponding signals G0 and G1 and selectively provide stored information from selected memory cell strings 302 associated with lines 370 and 371 to line 374. Transistors 322 and 323 can respond to corresponding signals G2 and G3 and selectively provide stored information from selected memory cell strings 302 associated with lines 372 and 373 to line 375.

Signals G0 and G1 can be activated such that only one of transistors 320 and 321 can turn on at a time. Thus, only one of lines 370 and 371 can be coupled to line 374 at a time. Signals G0 and G1 can also be activated such that both transistors 320 and 321 can turn off at a given time. For example, both of transistors 320 and 321 can turn off (e.g., at the same time) when none of memory cell strings 302 associated with lines 370 and 371 are selected to provide stored information during a read memory operation.

Signals G2 and G3 can be activated such that only one of transistors 322 and 323 can turn on at a time. Thus, only one of lines 372 and 373 can be coupled to line 375 at a time. Signals G2 and G3 can also be activated such that both transistors 322 and 323 can turn off at a given time. For example, both of transistors 322 and 323 can turn off (e.g., at the same time) when none of memory cell strings 302 associated with lines 372 and 373 are selected to provide stored information during a read memory operation.

Depending on which of memory cell strings 302 associated with lines 370 and 371 is selected to provide stored information, transistors 320 and 321 can be configured to couple either line 370 or line 371 to line 374. Transistors 320 and 321 can be configured to couple line 370 to line 374 or line 371 to line 374 one at time (not simultaneously). For example, if one of memory cell strings 302 associated with line 370 is selected to provide stored information, transistor 320 can turn on and couple line 370 to line 374. Transistor 321 can turn off (or remains off), leaving line 371 uncoupled (or not coupled) to line 374. Thus, stored information from at least one selected memory cell strings 302 associated with line 370 can be provided by line 370 (e.g., in the form of signal ABL0) to line 374 by transistor 320. In another example, if one of memory cell strings 302 associated with line 371 is selected to provide stored information, transistor 321 can turn on and couple line 371 to line 374. Transistor 320 can turn off (or remains off), leaving line 370 uncoupled (or not coupled) to line 374. Thus, stored information from at least one selected memory cell strings 302 associated with line 371 can be provided by line 371 (e.g., in the form of signal ABL1) to line 374 by transistor 321.

Depending on which of memory cell strings 302 associated with lines 372 and 373 is selected to provide stored information, transistors 322 and 323 can be configured to couple either line 372 or line 373 to line 375. Transistors 322 and 323 can couple line 372 to line 375 or line 373 to line 375 one at time (not simultaneously). For example, if one of memory cell strings 302 associated with line 372 is selected to provide stored information, transistor 322 can turn on and couple line 372 to line 375. Transistor 323 can turn off (or remain off), leaving line 373 uncoupled (or not coupled) to line 375. Thus, stored information from at least one selected memory cell strings 302 associated with line 372 can be provided by line 375 (e.g., in the form of signal LBL23) to line 375 by transistor 322. In another example, if one of memory cell strings 302 associated with line 373 is selected to provide stored information, transistors 322 and 323 operate to couple line 373 to line 375, leaving line 372 uncoupled (or not coupled) to line 375. Thus, stored information from at least one selected memory cell strings 302 associated with line 373 can be provided by line 373 (e.g., in the form of signal LBL23) to line 375 by transistor 323.

FIG. 3 shows an example of four lines 370, 371, 372, and 373) and three memory cell strings 302 coupled to each of these four lines. The number of lines and memory cell strings coupled to each line may vary. FIG. 3 also shows an example of two lines 374 and 375; the number of these lines may vary. However, the number of lines 374 and 375 (e.g., two) can be less than (e.g., equal to one half of) the number of lines 370, 371, 372, and 373 (e.g., four). The number of lines 374 and 375 can also be less than (e.g., equal to one half of) the number of transistors 320, 321, 322, and 323 (e.g., four).

Figure 5:
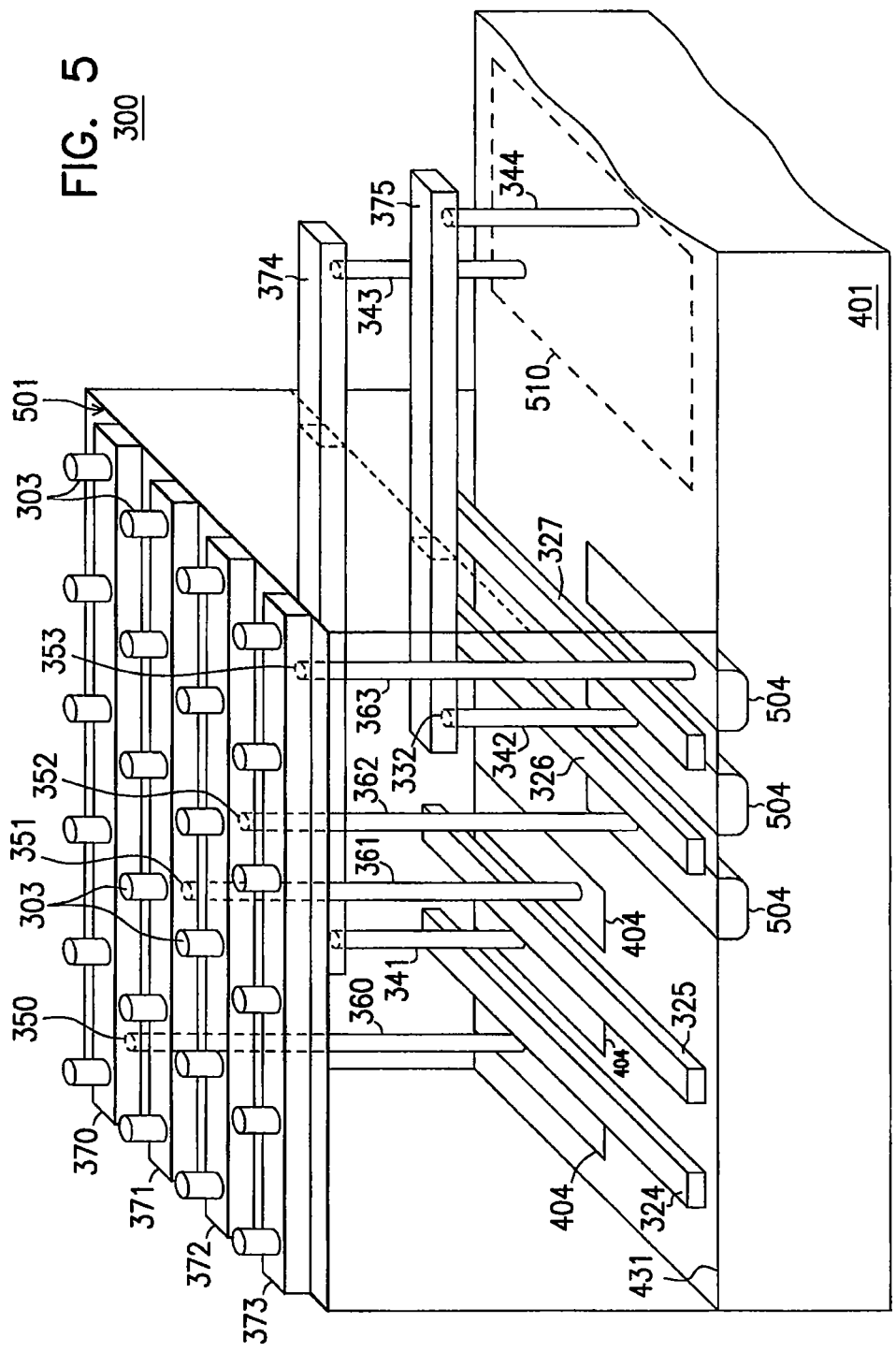
FIG. 5 shows additional components of the structure of the portion of the memory device of FIG. 4A, according to an embodiment of the invention.

FIG. 4A shows a three-dimensional (3-D) view of a structure of a portion of memory device 300 of FIG. 3, according to an embodiment of the invention. FIG. 4B shows some detail of line 371 of FIG. 4A. The structure of memory device 300 in FIG. 4A includes lines 370 and 371 and some components of select circuit 306, such as transistors 320 and 321. The structure of other components of memory device 300, such as lines 372 and 373, and transistors 322 and 323, are shown in FIG. 5.

For simplicity and to avoid obscuring the components shown in the structures of memory device 400 and other memory devices described herein, some components of a memory device (e.g., dielectric material) are omitted from these structures.

The following description refers to FIG. 3 and FIG. 4A and FIG. 4B. For simplicity, FIG. 4A and FIG. 4B omit memory cell strings 302 coupled to lines 371 and 370 at connections 303. Connections 303 can be structured as conductive connections that can include conductive material, such as doped silicon or other conductive material.

As shown in FIG. 4A, lines 370 and 371 can be located between substrate 401 and memory cell strings 302 (not shown in FIG. 4A) that are coupled to lines 370 and 371 at connections 303 in FIG. 4A.

Substrate 401 can include doped regions 404, which can form sources and drains of transistors 320 and 321 (FIG. 3). Substrate 401 and doped regions 404 can include material of different conductivity types. For example, substrate 401 can include p-type material (e.g., p-type doped-silicon) and doped regions 404 can include n-type material (n-type doped-silicon). In another example, substrate 401 can include n-type material and doped regions 404 can include p-type material.

As shown in FIG. 4A, two of doped regions 404 can be coupled to lines 370 and 371 through lines 360 and 361. Each of lines 360 and 361 has a length in the Z-direction. One of doped regions 404 coupled to node 331 through line 341 can be shared (e.g., as a common drain or source) by transistors 320 and 321.

As shown in FIG. 4B, line 371 has opposing sides 421 and 422 in the Z-direction. Line 371 also has portions 441, 442, and 443, which form a continuous part of line 371 along the length of line 371 in the X-direction. Memory cell strings 302 (FIG. 3) can be located on side 421 of line 371. Transistors 320 and 321 (FIG. 3) can be located on side 422 of line 371. One of connections 303 of one of memory cells string 302 (FIG. 3) can be directly coupled to (e.g., directly contacting) line 371 at portion 441. Another one of connections 303 of another one of memory cell string 302 (FIG. 3) can be directly coupled to (e.g., directly contacting) line 371 at portion 442. Line 361 (which is directly coupled to transistor 321) can be directly coupled to (e.g., directly contacting) the line 371 at portion 443.

Line 370 in FIG. 4A can also have structure similar to that of line 371, such as the structure shown in FIG. 4B. Thus, as shown in FIG. 4A, memory cell strings 302 (FIG. 3) can be located on side of line 370 and can be directly coupled to some portions of line 370. Transistors 320 and 321 (FIG. 3) can be located on another side 422 of line 371, and line 360 (which is directly coupled to transistor 320) can be directly coupled to another portion of line 370.

Gates 324 and 325, as shown in FIG. 4A, can be located between a surface 431 of substrate 401 and lines 370 and 371, such that gates 324 and 325 can be located in a device level below another device level where lines 370 and 371 are located and above surface 431. Line 374 can be located between line 370 (and 371) and gates 324 and 325, such that line 374 can be located in a device level below another device level where line 370 (and 371) is located and above a device level where gates 324 and 325 are located.

FIG. 5 shows additional components of the structure of the portion of memory device 300 of FIG. 4A, according to an embodiment of the invention. In addition to the components shown in FIG. 4A, the structure of memory device 300 in FIG. 5 further includes lines 372 and 373 and other components of select circuit 306 of FIG. 3, such as transistors 322 and 323 (FIG. 3).

For simplicity, description of similar or identical components among the figures is not repeated. For example, the description of lines 370 and 371 and some of the components select circuit 306 (e.g., gates 324 and 325 and doped regions 404) is not repeated in the description of FIG. 5.

As shown in FIG. 5, lines 372 and 373 can be located in the same device level as lines 370 and 371. Thus, lines 372 and 373 can be located between substrate 401 and memory cell strings 302 (not shown in FIG. 5) that are coupled to lines 372 and 373 at connections 303 in FIG. 5.

Substrate 401 can include doped regions 504, which can form sources and drains of transistors 322 and 323 (FIG. 3). Doped regions 504 can include a material similar to or identical to that of doped regions 404.

Substrate 401 can include a region 510 where at least a portion of at least some components of sense amplifiers 310 and 312 (FIG. 3) can be located. For example, sources and drains of transistors 311 and 313 (FIG. 3) can be located in region 510.

As shown in FIG. 5, two of doped regions 504 can be coupled to lines 372 and 373 through lines 362 and 363. Each of lines 362 and 363 has a length in the Z-direction. One of doped regions 504 can be coupled to node 332 through line 342 and can be shared (e.g., as a common drain or source) by transistors 322 and 323.

As shown in FIG. 5, gates 326 and 327 can be located in the same device level as gates 324 and 325. Thus, gates 326 and 327 can be located between surface 431 and lines 372 and 373, such that gates 326 and 327 can be located in a device level below another device level where lines 372 and 373 are located and above a surface 431.

Line 375 can be located in the same device level as line 374. Thus, line 375 can be located between line 372 (and 373) and gates 326 and 327, such that line 375 can be located in a device level below another device level where lines 372 and 373 are locate and above a device level where gates 326 and 327 are located.

FIG. 5 also shows a location 501, which can correspond to a boundary (e.g., an edge) of memory array 301 (FIG. 3) that contains memory cell strings 302 (FIG. 3).

As shown in FIG. 5, lines 374 and 375 can extend beyond location 501 and can be coupled to components in region 510 through lines 343 and 344. For example, lines 374 and 375 can be coupled to the drains (or sources) of transistors 311 and 313 (FIG. 3), respectively, of sense amplifiers 310 and 312 in region 510.

FIG. 6A shows a top view of the structure of the portion of memory device 300 of FIG. 5, according to an embodiment of the invention. As shown in FIG. 6A, each of lines 370, 371, 372, and 373 has a length in the X-direction, which is perpendicular (or substantially perpendicular) to the Y-direction. Lines 370, 371, 372, and 373 can be parallel (or substantially parallel) with each other and can have the same (or substantially the same) length. Each of lines 370, 371, 372, and 373 can end at location 501.

Each of lines 374 and 375 has a length in the Y-direction can include a portion that extends beyond location 501 in the Y-direction. Lines 374 and 375 can have different lengths.

Each of gates 324, 325, 326, and 327 has a length in the X-direction. Gates 324, 325, 326, and 327 can be parallel (or substantially parallel) with each other and can have the same (or substantially the same) length.

Lines 370, 371, 372, 373, 374, and 375 and gates 324, 325, 326, and 327 can be formed from conductive material, such as polysilicon, metal, or other conductive material.

FIG. 6A shows an example where lines 374 and 375 and associated nodes 331 and 332 are aligned with (e.g., located directly under) lines 370 and 372, respectively. In an alternative arrangement, line 374 and node 331 can still be located under line 370 but they may not be aligned with (e.g., may not be directly under) line 370. For example, line 374 and node 331 can be located under lines 370 and 371 and in a space (from the top view) between lines 370 and 371. In such an alternative arrangement, line 375 and node 332 can still be located under line 372 but they may not be aligned with (e.g., may not be directly under) line 372. For example, line 375 and node 332 can be located under lines 372 and 373 and in a space (from the top view) between lines 372 and 373.

Figure 6B:
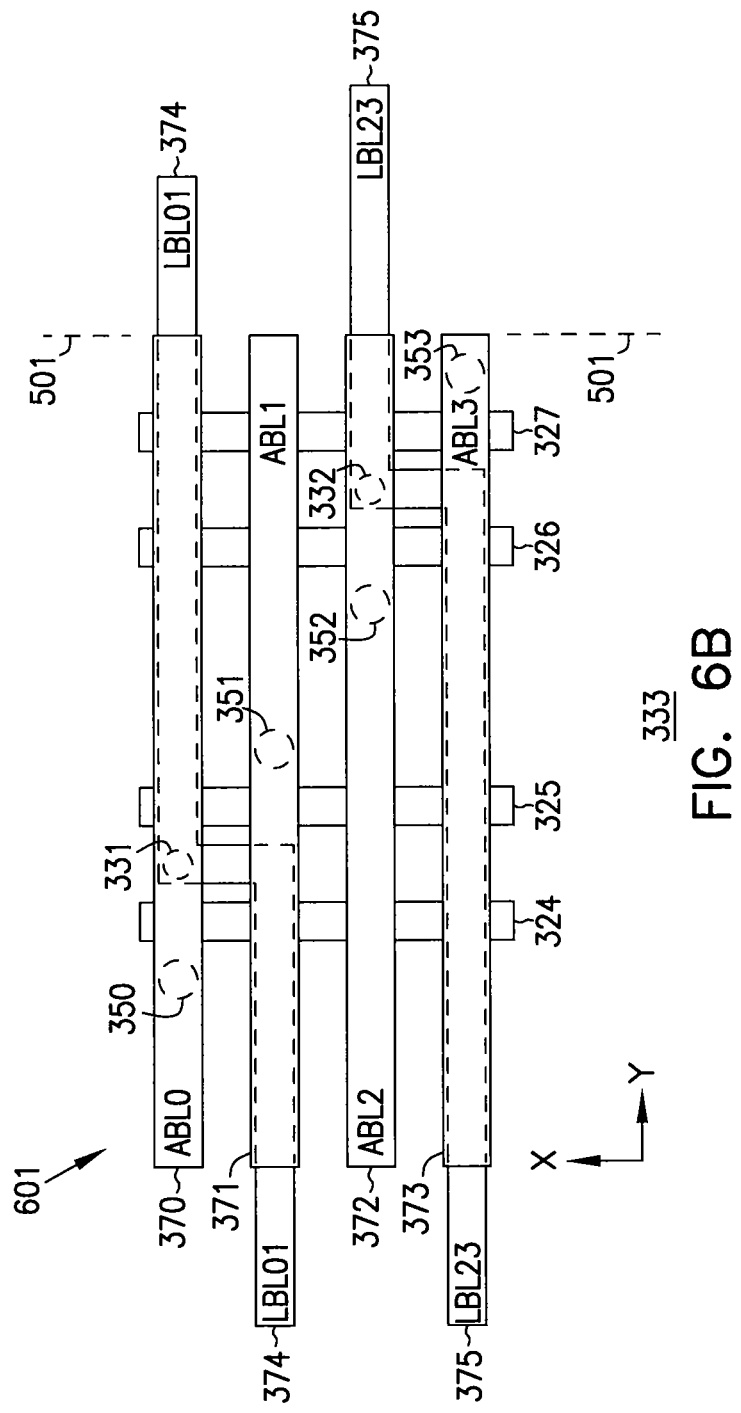
FIG. 6B shows a top view of the structure of the portion of memory device having local data lines extending in multiple directions, according to an embodiment of the invention.

FIG. 6B shows a top view of the structure of the portion of memory device 333 having each of lines (e.g., local data lines) 374 and 375 extending in multiple directions, according to an embodiment of the invention. Memory device 333 can be a variation of memory device 300 of FIG. 3 through FIG. 6A. Thus, the structure shown in FIG. 6B can be variation of the structure shown in FIG. 6A. In FIG. 6A and FIG. 6B, similar or identical components are designated with the same labels. For simplicity, description of similar or identical components in FIG. 6A and FIG. 6B is not repeated.

As shown in FIG. 6B, memory device 333 can include a memory array 601 where each of lines 374 and 375 can extend along the Y-direction but in both directions (e.g., left and right of FIG. 6B) relative to the location of node 331 (coupled to line 374) or node 332 (coupled to line 375).

Figure 7A:
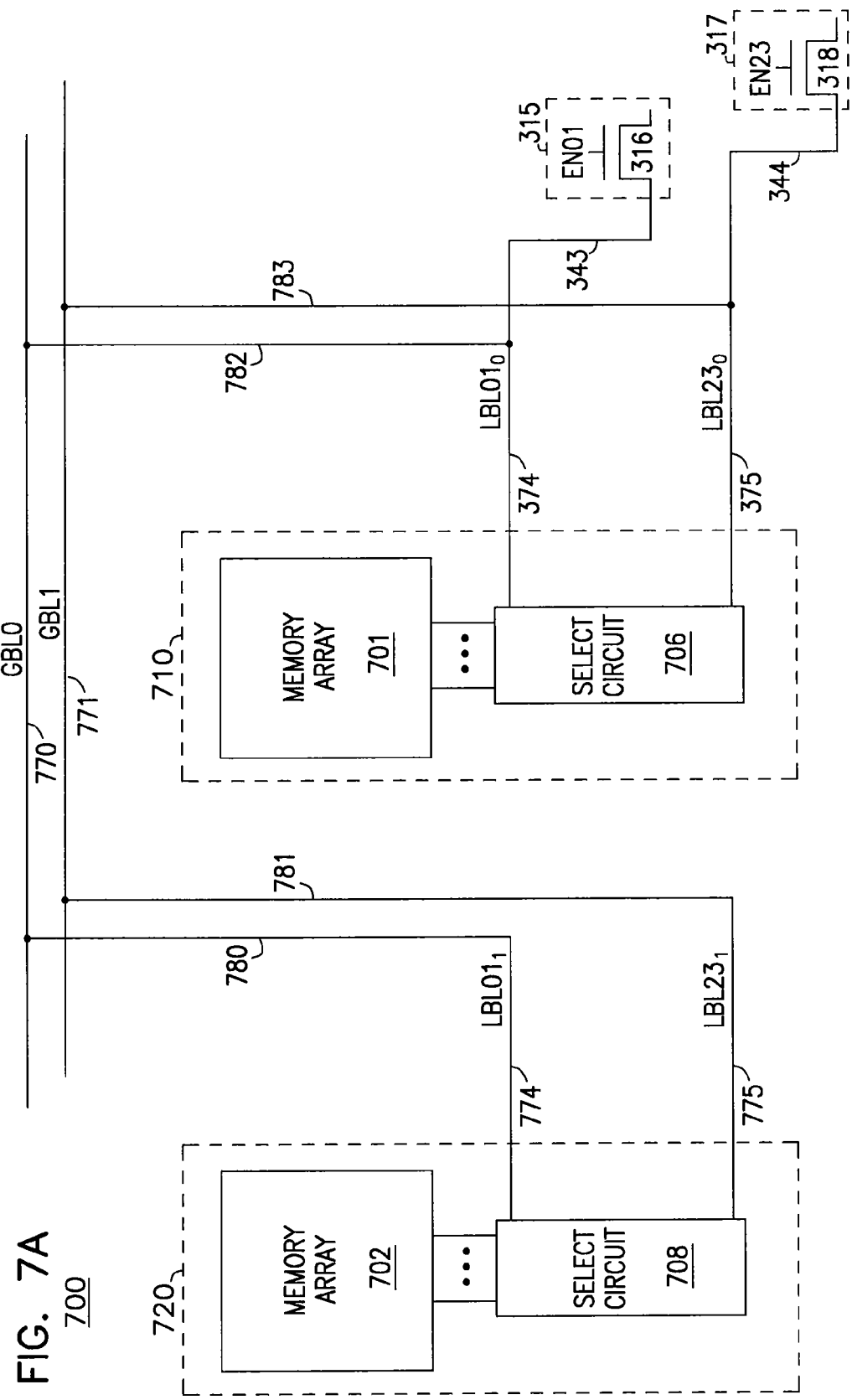
FIG. 7A shows a schematic diagram of a portion of a memory device including memory arrays and data lines, according to an embodiment of the invention.

FIG. 7A shows a schematic diagram of a portion of a memory device 700 including memory arrays 701 and 702 and lines 770 and 771, according to an embodiment of the invention. Memory device 700 can include a device portion 710 having memory array 701 and a select circuit 706, and a device portion 720 having memory array 702 and a select circuit 708. Each of memory arrays 701 and 702 can include memory array 301 described above with reference to FIG. 3 through FIG. 6A. Each of select circuits 706 and 708 in FIG. 7A can include select circuit 306 described above with reference to FIG. 3 through FIG. 6A.

Memory device 700 can also include components that are similar to or identical to those of memory device 300. For example, memory device 700 can include sense amplifiers 315 and 317 and lines 343, 344, 374, and 375 that can correspond to those of memory device 300 described above with reference to FIG. 3 through FIG. 6A.

Signals $LBL01_0$ and $LBL23_0$ in FIG. 7A can correspond to signal LBL01 and LBL23, respectively, of FIG. 3 through FIG. 6A. Signals $LBL01_1$ and $LBL23_1$ (associated with lines 774 and 775) in FIG. 7A can correspond to signal LBL01 and LBL23 (associated with lines 374 and 375), respectively, of FIG. 3 through FIG. 6A.

Lines 770 and 771 in FIG. 7A can be structured as conductive lines and can form part of data lines (e.g., global bit lines) of memory device 700 to carry signals GBL0 and GBL1, respectively. As shown in FIG. 7A, line 770 can be coupled to lines 782 and 374 (associated with signal $LBL01_0$) and to lines 780 and 774 (associated with signal $LBL01_1$). Line 771 can be coupled to lines 783 and 375 (associated with signal $LBL23_0$) and lines 781 and 775 (associated with signal $LBL23_1$).

Signal GBL0 can correspond to either signal $LBL01_0$ or $LBL01_1$. Select circuits 706 and 708 and sense amplifiers 315 and 317 can be configured such that signals $LBL01_0$ and $LBL01_1$ can only be provided one at a time. Thus, signal GBL0 can correspond to signal $LBL01_0$ at one time and correspond to signal $LBL01_1$ at another time.

Signal GBL1 can correspond to either signal $LBL23_0$ or $LBL23_1$. Select circuits 706 and 708 and sense amplifiers 315 and 317 can be configured such that signals $LBL23_0$ and $LBL23_1$ can only be provided to line 771 one at a time. Thus, signal GBL1 can correspond to signal $LBL23_0$ at one time and correspond to signal $LBL23_1$ at another the time.

Memory device 700 can include an I/O circuit (e.g., I/O circuit 117 of FIG. 1) that can receive signals GBL0 and GBL1 for further processing.

FIG. 7A shows two lines 770 and 771 and two memory arrays 701 and 702 as an example. The number of lines and memory arrays may vary.

Memory device 700 can include a single die, such as a semiconductor (e.g., silicon) die, where device portions 710 and 720 can be located in different areas of the same single die. Alternatively, memory device 700 can include dice that are separated from each other, and device portion 710 can be located in one of the dice and device portion 720 can be located in another one of the dice.

Figure 7B:
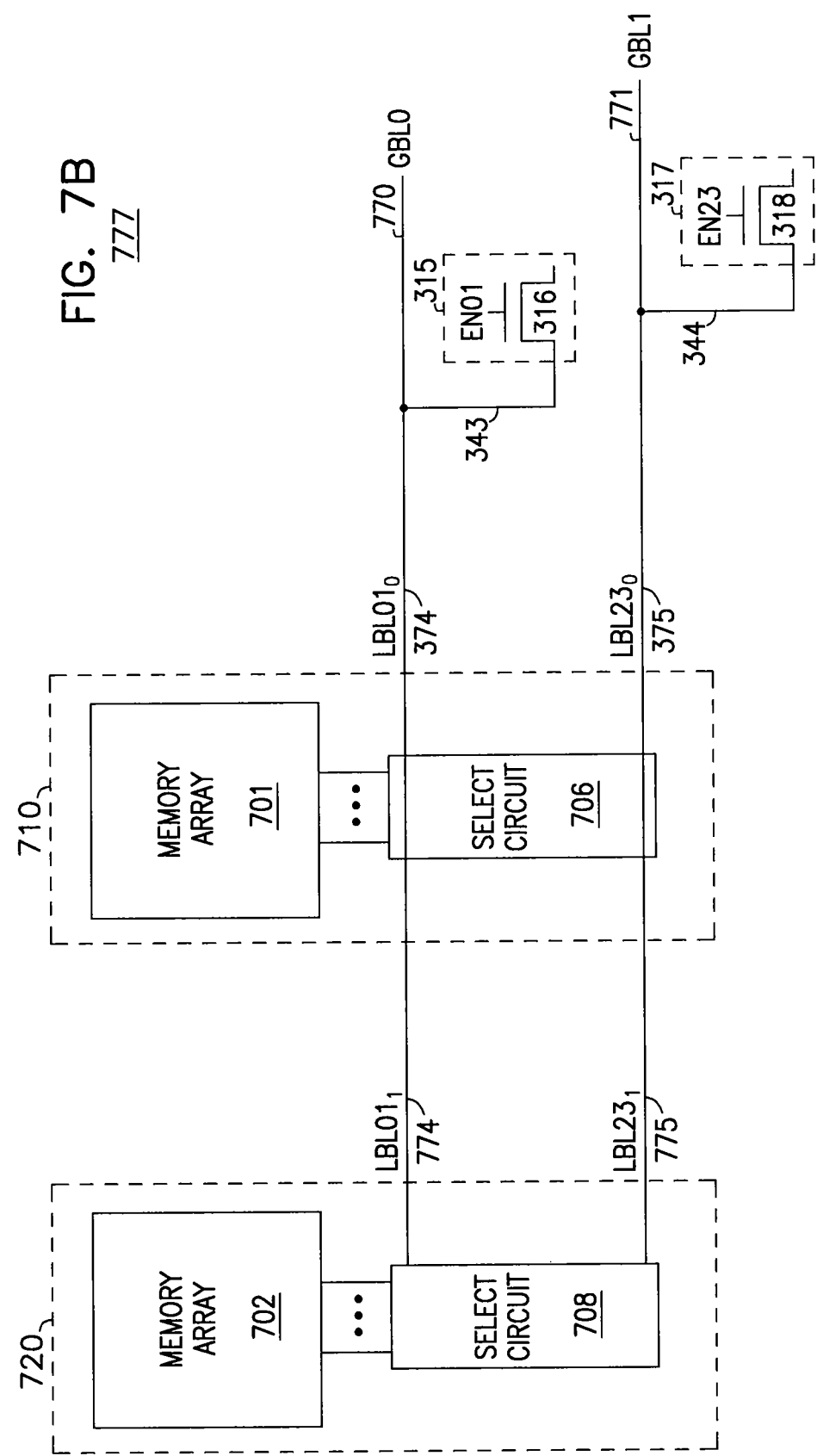
FIG. 7B shows a schematic diagram of a portion of a memory device including local data lines arranged to form global data lines, according to an embodiment of the invention.

FIG. 7B shows a schematic diagram of a portion of a memory device 777 including lines 374, 375, 774, and 775 arranged to form global data lines 770 and 771, according to an embodiment of the invention. Memory device 777 can be a variation of memory device 700 of FIG. 7A. Thus, the structure shown in FIG. 7B can be a variation of the structure shown in FIG. 7A. In FIG. 7A and FIG. 7B, similar or identical components are designated with the same labels. Each of memory arrays 701 and 702 in FIG. 7B can include memory array 601 of FIG. 6B. For simplicity, description of similar or identical components in FIG. 6B, FIG. 7A, and FIG. 7B is not repeated.

In FIG. 7B, lines 374, 774, and 770 can be structured as the same line. For example, lines 374, 774, and 770 can be structured as both a local data line and a global data line. Thus, lines 374, 774, and 770 can be physically formed in the same device level (e.g., device level 292 in FIG. 2). Similarly, lines 375, 775, and 771 can be structured as the same line. For example, lines 375, 775, and 771 can be structured as both a local data line and a global data line. Thus, lines 375, 775, and 771 can be physically formed in the same device level (e.g., device level 292 in FIG. 2).

FIG. 8 shows a 3-D view of a structure of the portion of memory device 700 of FIG. 7A, according to an embodiment of the invention. As shown in FIG. 8, memory device 700 can include substrates 401 and 801, which can be included in device portions 710 and 720, respectively. Substrate 401 in FIG. 8 can correspond to substrate 401 of FIG. 5.

Lines 370, 371, 372, and 373 and connections 303 associated with memory cell strings (not shown in FIG. 8) coupled to these lines can correspond to those described above with reference to FIG. 3 through FIG. 6A.

As shown in FIG. 8, lines 770 and 771 can be formed above memory cell strings (not shown in FIG. 8) of memory arrays 701 and 702 (FIG. 7A), such that the memory cell strings can be between lines 770 (and line 771) and lines 370, 371, 372, and 373. Each of lines 770 and 771 has a length in the X-direction.

Memory device 700 can include region 510 where at least a portion of at least some components of sense amplifiers (e.g., sense amplifiers 315 and 317 in FIG. 7A) associated with device portions 710 and 720 can be located in.

FIG. 8 shows an example where components of sense amplifiers (coupled to lines 343 and 344) of memory device 700 can be located in only device portion 710 (e.g., formed in region 510 of substrate 401). In an alternative arrangement, some of the components of the sense amplifiers or all of the components of the sense amplifiers can be located in device portion 720 (e.g., formed in a region of substrate 801). Thus, in an alternative arrangement, sense amplifiers (e.g., sense amplifiers 315 and 317 in FIG. 7A) associated with memory arrays 701 and 702 can be located in the same substrate (e.g., substrate 401 or 801) or in more than one substrate (e.g., in both substrates 401 and 801).

A variation of memory device 700 of FIG. 8 can exclude (in other words, not including) lines 780, 781, 782, and 783 from the structure shown in FIG. 8. Such a variation can correspond a structure of memory device 777 of FIG. 7B. In the variation, lines 374, 774, and 770 can be located in the same device level (e.g., a device level where lines 374 and 774 are located) of memory device 700. Lines 375, 775, and 771 can be located in the same device level (e.g., a device level where lines 375 and 775 are located) of memory device 700.

Figure 9:
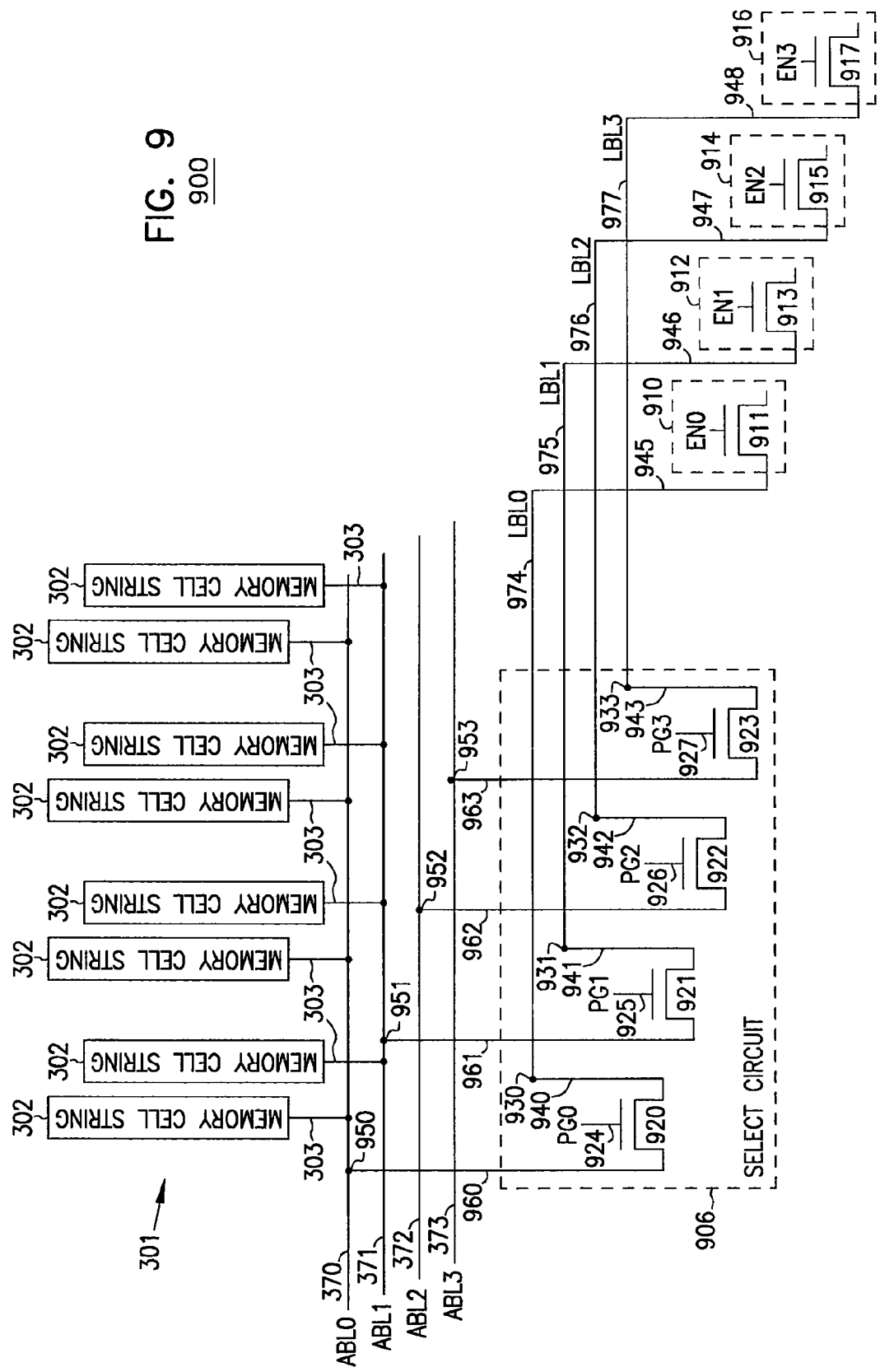
FIG. 9 shows a schematic diagram of a portion of another memory device including a memory array and a select circuit, according to an embodiment of the invention.

FIG. 9 shows a schematic diagram of a portion of a memory device 900 including memory array 301 and a select circuit 906, according to an embodiment of the invention. Memory device 900 can be associated with memory device 100 of FIG. 1, such as forming a portion of memory array 101 and select circuit 106, respectively, of memory device 100.

As shown in FIG. 9, memory device 900 can include lines 370, 371, 372, and 373 located between memory cell strings 302 of memory array 301 and select circuit 906, which can include a number of transistors 920, 921, 922, and 923 configured as respective pass gates.

Memory device 900 can include components similar to or identical to those of memory device 300 of FIG. 3, such as memory array 301, memory cell strings 302, and lines 370, 371, 372, and 373 with associated signals ABL0, ABL1, ABL2, and ABL3. Some of the differences between memory device 900 and memory device 300 include the connections among lines 370, 371, 372, and 373, select circuit 906, and the number of lines 974, 975, 976, and 977 in FIG. 9.

As shown in FIG. 9, the number of lines 974, 975, 976, and 977 (e.g., four) can be equal to the number of lines 370, 371, 372, and 373 (e.g., four). The number of lines 974, 975, 976, and 977 can also be equal to the number of transistors 920, 921, 922, and 923 (e.g., four).

Each of transistors 920, 921, 922, and 923 can be coupled between one of lines 370, 371, 372, and 373 and one of lines 974, 975, 976, and 977. For example, transistor 920 can be coupled to line 370 through line 960 and a node 950 and coupled to line 974 through line 940 and a node 930. Transistor 921 can be coupled to line 371 through line 961 and a node 951 and coupled to line 975 through line 941 and a node 931. Transistor 922 can be coupled to line 372 through line 962 and a node 952 and coupled to line 976 through line 942 and a node 932. Transistor 923 can be coupled to line 373 through line 963 and a node 953 and coupled to line 977 through line 943 and node 933. Lines 940, 941, 942, 943, 960, 961, 962, and 963 can be structured as conductive lines.

Transistors 920, 921, 922, and 923 can respond to corresponding signals PG0, PG1, PG2, and PG3, at gates 924, 925, 926, and 927, respectively. Signals PG0, PG1, PG2, and PG3 can be activated such that transistors 920, 921, 922, and 923 can turn on simultaneously (e.g., at the same time or substantially the same time). Thus, lines 370, 371, 372, and 373 can be simultaneously coupled to lines 974, 975, 976, and 977, respectively, when transistors 920, 921, 922, and 923 turn on. During a read operation, if memory cell strings 302 associated with each of lines 370, 371, 372, and 373 are selected to provide stored information, transistors 920, 921, 922, and 923 can turn on to provide stored information from the selected memory cell strings 302 (associated with lines 370, 371, 372, and 373) to lines 974, 975, 976, and 977, respectively.

Alternatively, signals PG0, PG1, PG2, and PG3 can be activated such that fewer than all of transistors 920, 921, 922, and 923 and can turn on at a time. Thus, during a read operation, one set (e.g., fewer than all) of transistors 920, 921, 922, and 923 can turn on while another set (e.g., fewer than all) of transistors 920, 921, 922, and 923 can turn off (or remain off). Therefore, during a read operation, one set (e.g., fewer than all) of lines 370, 371, 372, and 373 can be coupled to a corresponding set of lines 974, 975, 976, and 977 while another set (e.g., fewer than all) of lines 370, 371, 372, and 373 can be uncoupled to another corresponding set of lines 974, 975, 976, and 977.

Memory device 900 can include sense amplifiers 910, 912, 914, and 916 having associated transistors 911, 913, 915, and 917 coupled to lines 945, 946, 947, and 948, respectively. Transistors 911, 913, 915, and 917 can respond to signals EN0, EN1, EN2, and EN3, respectively, to enable sense amplifiers 910, 912, 914, and 916 to sense signals LBL0, LBL1, LBL2, and LBL3, respectively.

Signals LBL0, LBL1, LBL2, and LBL3 can correspond to signals ABL0, ABL1, ABL2, and ABL3B, respectively. Based on the values of signals LBL0, LBL1, LBL2, and LBL3, sense amplifiers 910, 912, 914, and 916 can determine corresponding values of stored information in memory cell strings 302. Sense amplifiers 910, 912, 914, and 916 may provide these sensed values (e.g., in the form of signals) to other components of memory device 900 (e.g., an I/O circuit, such as I/O circuit 117 of FIG. 1) for further processing.

FIG. 10 shows a 3-D view of a structure of a portion of memory device 900 of FIG. 9, according to an embodiment of the invention. The structure of memory device 900 in FIG. 10 includes lines 370 and 371 and some components of select circuit 906, such as transistors 920 and 921. The structure of other components of memory device 900, such as lines 372 and 373, and transistors 922 and 923, are shown in FIG. 11.

The following description refers to FIG. 9 and FIG. 10. For simplicity, FIG. 10 omits memory cell strings 302 (FIG. 9) coupled to lines 371 and 370 at connections 303.

As shown in FIG. 10, lines 370 and 371 can be located between substrate 1001 and memory cell strings 302 (not shown in FIG. 10) that are coupled to lines 370 and 371 at connections 303 in FIG. 10.

Substrate 1001 can include doped regions 1004, which can form sources and drains of transistors 920 and 921 (FIG. 9). Substrate 1001 and doped regions 1004 can include material similar to or identical to those of substrate 401 and doped regions 404 of FIG. 4.

Each of doped regions 1004 can be coupled to one of lines 370, 371, 974, and 975 through a respective line 940, 941, 960, or 961. Each of lines 940, 941, 960, and 961 has a length in the Z-direction.

As shown in FIG. 10, gates 924 and 925 can be located between a surface 1031 of substrate 1001 and lines 370 and 371, such that gates 924 and 925 can be located in a device level below another device level where lines 370 and 371 are located and above a surface 1031.

Lines 974 and 975 can be located between line 370 (and 371) and gates 924 and 925, such that lines 974 and 975 can be located in device level below another device level where lines 370 and 371 are located and above a device level where gates 924 and 925 are located.

FIG. 11 shows additional components of the structure of the portion of memory device 900 of FIG. 10, according to an embodiment of the invention. In addition to the components shown in FIG. 10, the structure of memory device 900 in FIG. 11 further includes lines 372 and 373 and other components of select circuit 906, such as transistors 922 and 923.

As shown in FIG. 11, lines 372 and 373 can be located in the same device level as lines 370 and 371. Thus, lines 372 and 373 can be located between substrate 1001 and memory cell strings 302 (not shown in FIG. 11) that are coupled to lines 372 and 373 at connections 303 in FIG. 11.

Substrate 1001 can include doped regions 1105, which can form sources and drains of transistors 922 and 923 (FIG. 9). Doped regions 1105 can include a material similar to or identical to that of doped regions 1004 (FIG. 10).

Substrate 1001 can include a region 1110 where at least a portion of at least some components of sense amplifiers 910, 912, 914, and 916 (FIG. 9) can be located. For example, sources and drains of transistors 911, 913, 915, and 917 (FIG. 9) can be located in region 1110.

Each of doped regions 1105 in FIG. 11 can be coupled to one of lines 372, 373, 976, and 977 through a respective line 942, 943, 962, or 963. Each of lines 942, 943, 962, and 963 has a length in the Z-direction.

As shown in FIG. 11, gates 926 and 927 can be located in the same device level as gates 924 and 925 between a surface 1031 of substrate 1001 and lines 372 and 373, such that gates 926 and 927 can be located in a device level below another device level where lines 372 and 373 are located and above surface 1031.

Lines 976 and 977 can be located in the same device level as lines 974 and 975 between line 372 (and 373) and gates 926 and 927, such that lines 976 and 977 can be located in a device level below another device level where lines 372 and 373 are located and above a device level where gates 926 and 927 are located.

FIG. 11 also shows a location 1101, which can correspond to a boundary (e.g., an edge) of memory array 301 (FIG. 9) that contains memory cells strings 302 (FIG. 9).

As shown in FIG. 11, lines 974, 975, 976, and 977 can extend beyond location 1101 and can be coupled to components in region 1110 through lines 945, 946, 947, and 948. For example, lines 974, 975, 976, and 977 can be coupled to the drains (or sources) of transistors 911, 913, 915, and 917 (FIG. 9), respectively, of sense amplifiers 910, 912, 914, and 916 in region 510

Figure 12A:
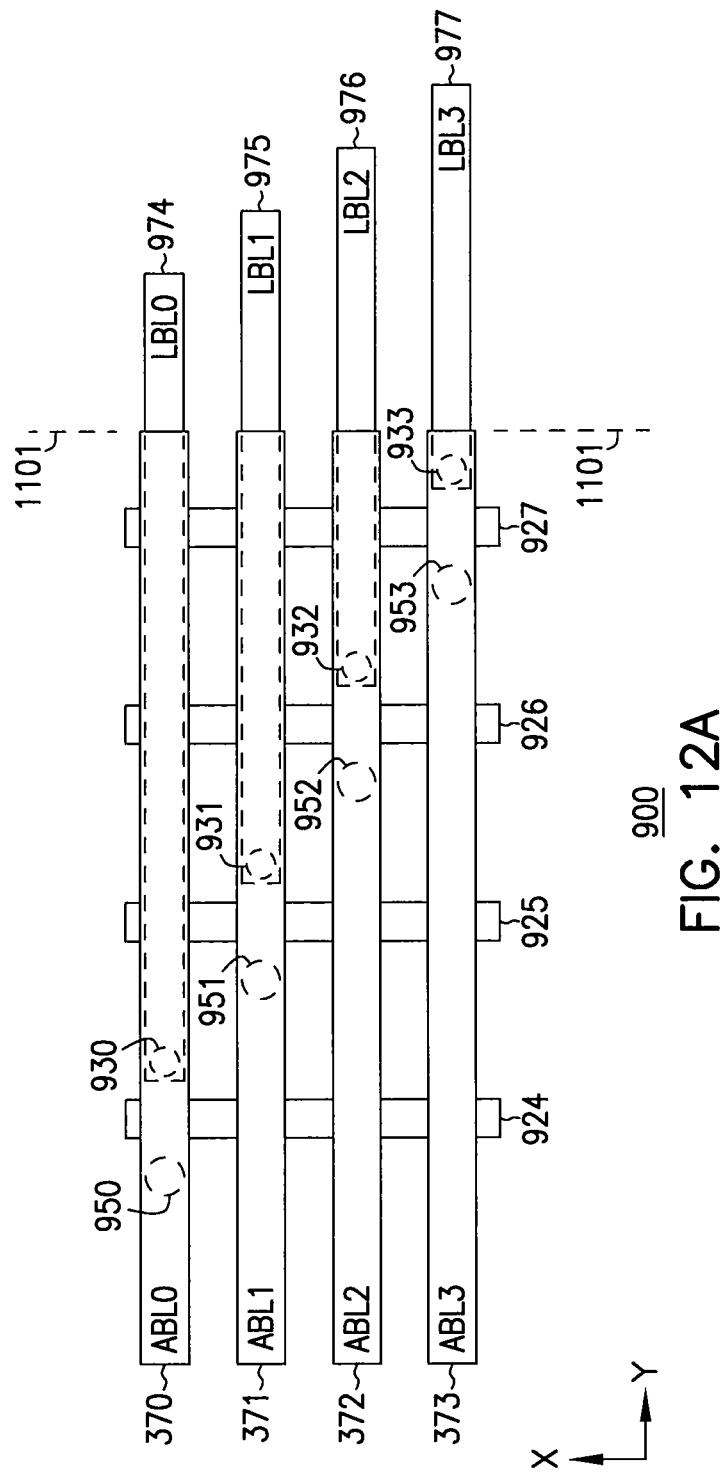
FIG. 12A shows a top view of the structure of the memory device of FIG. 11, according to an embodiment of the invention.

FIG. 12A shows a top view of the structure of memory device 900 of FIG. 11, according to an embodiment of the invention. As shown in FIG. 12A, each of lines 370, 371, 372, and 373 can end at location 1101. Each of lines 974, 975, 976, and 977 has a length in the Y-direction and can include a portion that extends beyond location 1101 in the Y-direction. Lines 974, 975, 976, and 977 can have different lengths and can include materials similar to or identical to those of lines 374 and 375 of memory device 300 of FIG. 3 through FIG. 6A.

As shown in FIG. 12A, each of gates 924, 925, 926, and 927 has a length in the X-direction. These gates can be parallel (or substantially parallel) with each other and can have the same (or substantially the same) length.

These gates 924, 925, 926, and 927 can include materials similar to or identical to those of gates 324, 325, 326, and 327 of memory device 300 of FIG. 3 through FIG. 6A.

FIG. 12A shows an example where lines 974, 975, 976, and 977 and associated nodes 930, 931, 932, and 933 are aligned (e.g., located directly under) lines 370, 371, 372, and 373, respectively. In an alternative arrangement, lines 974, 975, 976, and 977 and associated nodes 930, 931, 932, and 933 can still be located under lines 370, 371, 372, and 373 but lines 974, 975, 976, and 977 and associated nodes 930, 931, 932, and 933 may not be aligned with (may not be directly under) lines 370, 371, 372, and 373, respectively.

Figure 12B:
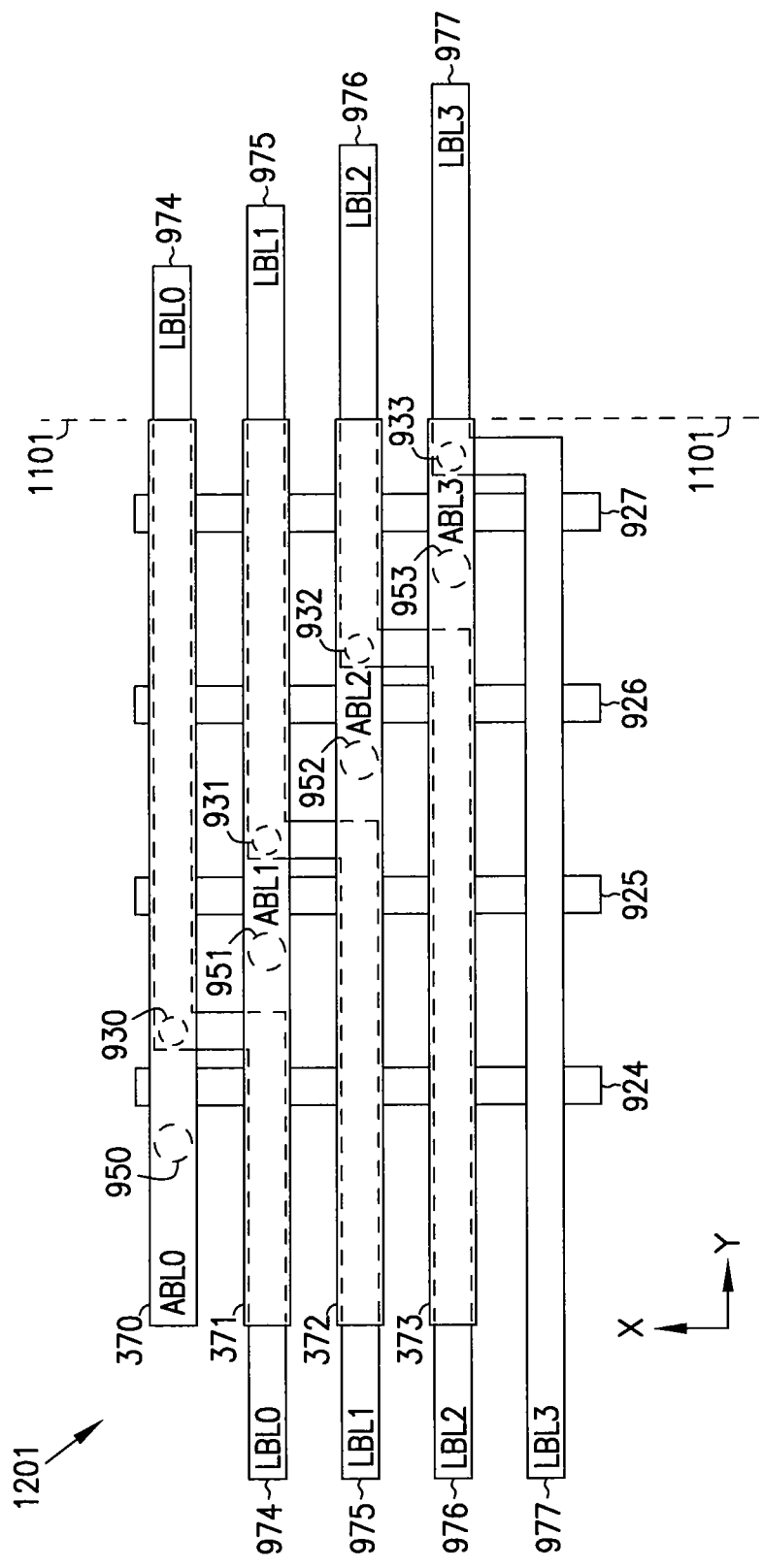
FIG. 12B shows a top view of the structure of the portion of memory device having local data lines extending in multiple directions, according to an embodiment of the invention.

FIG. 12B shows a top view of the structure of the portion of memory device 999 having each of lines (e.g., local data lines) 974, 975, 976, and 977 extending in multiple directions, according to an embodiment of the invention. Memory device 999 can be a variation of memory device 900 of FIG. 9 through FIG. 12A. Thus, the structure shown in FIG. 12B can be variation of the structure shown in FIG. 12A. In FIG. 12A and FIG. 12B, similar or identical components are designated with the same labels. For simplicity, description of similar or identical components in FIG. 12A and FIG. 12B is not repeated.

As shown in FIG. 12B, memory device 999 can include a memory array 1201 where each of lines 974, 975, 976, and 977 can extend along the Y-direction but in both directions (e.g., left and right of FIG. 12B) relative to the location of node 930, 931, 932, and 933, respectively.

Figure 13A:
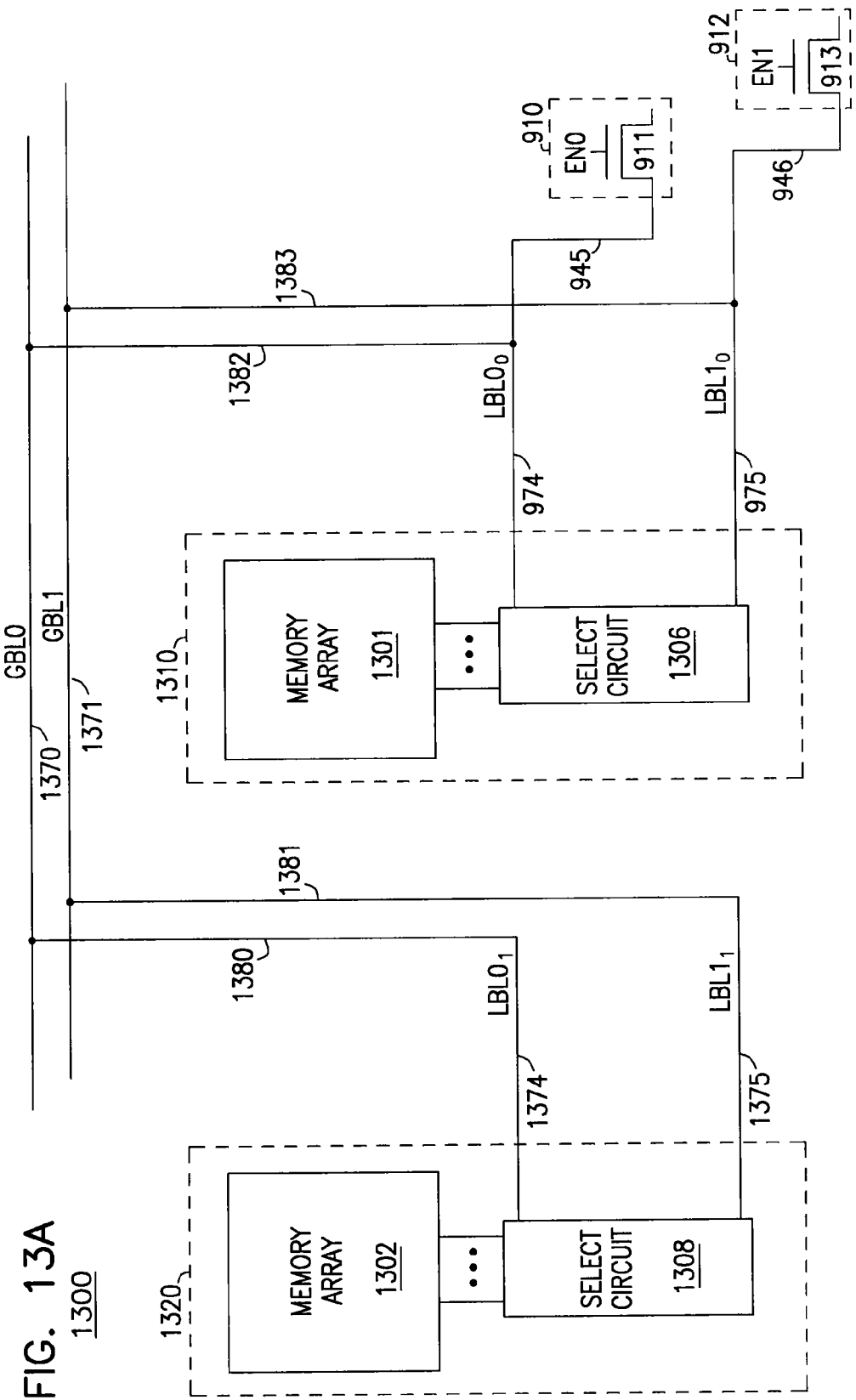
FIG. 13A shows a schematic diagram of a portion of a memory device including memory arrays, according to an embodiment of the invention.

FIG. 13A shows a schematic diagram of a portion of a memory device 1300 including memory arrays 1301 and 1302, according to an embodiment of the invention. Memory device 1300 can include a device portion 1310 having memory array 1301 and select circuit 1306 and a device portion 1320 having memory array 1302 and select circuit 1308. Each of arrays 1301 and 1302 and of select circuits 1306 and 1308 can include memory array 301 and select circuit 906, respectively, described above with reference to FIG. 9 through FIG. 12A.

Memory device 1300 can also include components that are similar to or identical to those of memory device 900 described above with reference to FIG. 9 through FIG. 12A. For example, memory device 1300 can include sense amplifiers 910 and 912 and lines 945, 946, 974, and 975.

Signals $LBL0_0$ and $LBL1_0$ in FIG. 13A can correspond to signal LBL0 and LBL1, respectively, of FIG. 9 through FIG. 12A. Signals $LBL0_1$ and $LBL1_1$ (associated with lines 1374 and 1375) can correspond to signal LBL0 and LBL1 (associated with lines 974 and 975), respectively, of FIG. 9 through FIG. 12A.

Lines 1370 and 1371 can be structured as conductive lines and can form part of data lines (e.g., global bit lines) of memory device 1300 to carry signals GBL0 and GBL1, respectively. As shown in FIG. 13A, line 1370 can be coupled to lines 1382 and 974 (associated with signal $LBL0_0$) and to lines 1380 and 1374 (associated with signal $LBL0_1$). Line 1371 can be coupled to lines 1383 and 975 (associated with signal $LBL1_0$) and to lines 1381 and 1375 (associated with signal $LBL1_1$).

Signal GBL0 can correspond to either signal $LBL0_0$ or $LBL0_1$. Select circuits 1306 and 1308 and sense amplifiers 910 and 912 can be configured such that signals $LBL0_0$ and $LBL0_1$ can only be provided one at a time. Thus, signal GBL0 can correspond to signal $LBL0_0$ at one time and correspond to signal $LBL0_1$ at another the time.

Signal GBL1 can correspond to either signal $LBL1_0$ or $LBL1_1$ Select circuits 1306 and 1308 and sense amplifiers 910 and 912 can be configured such that signals $LBL1_0$ and $LBL1_1$ can only be provided to line 1371 one at a time. Thus, signal GBL1 can correspond to signal $LBL1_0$ at one time and correspond to signal $LBL1_1$ at another the time.

Memory device 1300 can include an I/O circuit (e.g., I/O circuit 117 of FIG. 1) that can receive signals GBL0 and GBL1 for further processing.

FIG. 13A shows two lines 1370 and 1371 and two memory arrays 1301 and 1302 as an example. The number of lines and memory arrays may vary.

Memory device 1300 can include a single die (e.g., silicon die) where device portions 1310 and 1320 can be located in different areas of the same single die. Alternatively, memory device 1300 can include dice that are separated from each other and device portion 1310 can be located in one of the dice and device portion 1320 can be located in another one of the dice.

FIG. 13B shows a schematic diagram of a portion of a memory device 777 including lines 974, 975, 1374, and 1375 arranged to form global data lines 1370 and 1371, according to an embodiment of the invention. Memory device 1333 can be a variation of memory device 1300 of FIG. 13A. Thus, the structure shown in FIG. 13B can be a variation of the structure shown in FIG. 13A. In FIG. 13A and FIG. 13B, similar or identical components are designated with the same labels. Each of memory arrays 1301 and 1302 in FIG. 13B can include memory array 1201 of FIG. 12B. For simplicity, description of similar or identical components in FIG. 12B, FIG. 13A, and FIG. 13B is not repeated.

In FIG. 13B, lines 974, 1374, and 1370 can be structured as the same line. For example, lines 974, 1374, and 1370 can be structured as both a local data line and a global data line. Thus, lines 974, 1374, and 1370 can be physically formed in the same device level (e.g., device level 292 in FIG. 2). Similarly, lines 975, 1375, and 1371 can be structured as the same line. For example, lines 975, 1375, and 1371 can be structured as both a local data line and a global data line. Thus, lines 975, 1375, and 1371 can be physically formed in the same device level (e.g., device level 292 in FIG. 2).

FIG. 14 shows a 3-D view of a structure of the portion of memory device 1300 of FIG. 13A, according to an embodiment of the invention. As shown in FIG. 14, memory device 1300 can include a substrate 1001, which can be included in device portion 1310 (FIG. 13A) and a substrate 1401, which can be included in device portion 1320. Substrate 1001 in FIG. 14 can correspond to substrate 1001 of FIG. 11.

Lines 370 and 371 and connections 303 associated with memory cell strings (not shown in FIG. 14) coupled to these lines can correspond to those described above with reference to FIG. 9 through FIG. 12A.

As shown in FIG. 14, lines 1370 and 1371 can be formed above memory cell strings (not shown in FIG. 14) of device portion 1301 and 1302, such that the memory cell strings can be between lines 1370 (and line 1371) and lines 370, 371, 372, and 373. Each of lines 1370 and 1371 has a length in the X-direction.

Memory device 1400 can include region 1110 where at least a portion of at least some components of sense amplifiers associated with device portions 1310 and 1320 can be located.

FIG. 14 shows an example where components of sense amplifiers (coupled to lines 945 and 946) of memory device 1300 can be located in only device portion 1310 (e.g., formed in region 1110 of substrate 1001). In an alternative arrangement, some of the components of the sense amplifiers or all of the components of the sense amplifiers can be located in device portion 1320 (e.g., formed in a region of substrate 1401). Thus, in an alternative arrangement, sense amplifiers (e.g., sense amplifiers 910 and 912 in FIG. 13A) associated with memory arrays 1301 and 1302 can be located in the same substrate (e.g., substrate 1001 or 1401) or can be located in more than one substrate (e.g., in both substrates 1001 and 1401).

A variation of memory device 1300 of FIG. 14 can exclude (in other words, not including) lines 1380, 1381, 1382, and 1383 from the structure shown in FIG. 14. Such a variation can correspond a structure of memory device 999 of FIG. 12B. In the variation, lines 974, 1374, and 1370 can be located in the same device level (e.g., a device level where lines 974 and 1374 are located) of memory device 1300. Lines 975, 1375, and 1371 can be located in the same device level (e.g., a device level where lines 975 and 1375 are located) of memory device 1300.

Figure 15:
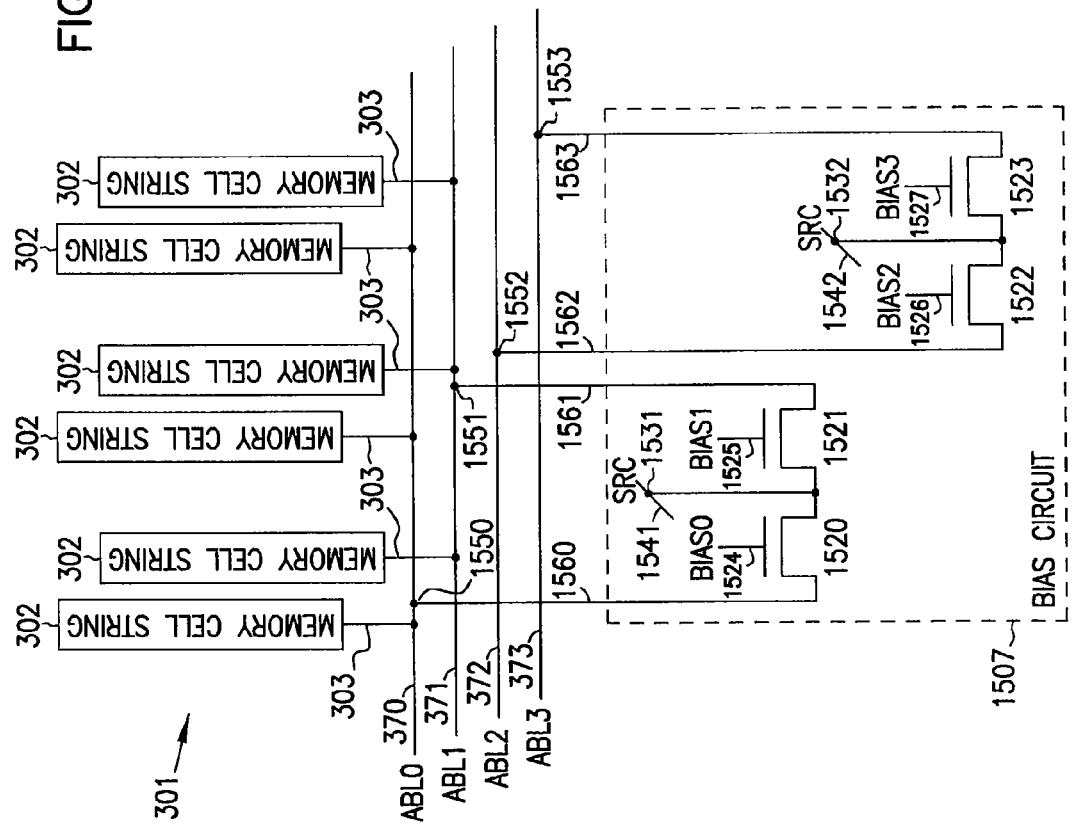
FIG. 15 shows a schematic diagram of a portion of a memory device including a memory array and a bias circuit, according to an embodiment of the invention.

FIG. 15 shows a schematic diagram of a portion of a memory device 1500 including a memory array 301 and a bias circuit 1507, according to an embodiment of the invention. Memory device 1500 can be associated with memory device 100 of FIG. 1, such as forming a portion of memory array 101 and bias circuit 107, respectively, of memory device 100.

Memory device 1500 can include components similar to or identical to those of memory device 300 of FIGS. 3 and 900 of FIG. 9, such as memory array 301, memory cell strings 302, and lines 370, 371, 372, and 373 with associated signals ABL0, ABL1, ABL2, and ABL3.

As shown in FIG. 15, lines 370, 371, 372, and 373 of memory device 1500 can be located between memory cell strings 302 of memory array 301 and bias circuit 1507.

Bias circuit 1507 can be configured to selectively couple lines 370, 371, 372, and 373 to different voltages in different memory operations (read and programming operations), depending upon, for example, which of lines 370, 371, 372, and 373 is a selected line or unselected line during such memory operations.

In the description herein, during a memory operation, a selected line refers to the line (e.g., one of lines 370, 371, 372, or 373) that is associated with a selected memory cell string (e.g., one of memory cell strings 302) during that memory operation. An unselected line refers to the line that is not associated with a selected memory cell string during that memory operation.

A selected memory cell string refers to the memory cell string that is selected to be accessed in a memory operation (e.g., read, programming, or erase operation), so that the memory device (e.g., memory device 1500) can sense information stored provided in the selected memory cell string (e.g., in a read operation) or write information into the selected memory cell string (e.g., in a programming operation). An unselected memory cell string refers to a memory cell string that is not selected to be accessed during a memory operation.

In FIG. 15, for example, if at least one of memory cell strings 302 associated with line 370 is a selected memory cell string during a memory operation (e.g., read or program), then line 370 can be a selected line during that memory operation. If none of memory cell strings 302 associated with line 370 is a selected memory cell string during a memory operation, then line 370 can be an unselected line during that memory operation. In another example, if at least one of memory cell strings 302 associated with line 371 is a selected memory cell string during a memory operation (e.g., read or program), then line 371 can be a selected line during that memory operation. If none of memory cell strings 302 associated with line 371 is a selected memory cell string during a memory operation, then line 371 can be an unselected line during that memory operation.

As shown in FIG. 15, bias circuit 1507 can include transistors 1520, 1521, 1522, and 1523 with associated gates 1524, 1525, 1526, and 1527 and signals BIAS0, BIAS1, BIAS2, and BIAS3. Transistor 1520 can couple line 370 to line 1541 through node 1550, line 1560, and node 1531. Transistor 1521 can couple line 371 to line 1541 through node 1551, line 1561, and node 1531. Transistor 1522 can couple line 372 to line 1542 through node 1552, line 1562, and node 1532. Transistor 1523 can couple line 373 to line 1542 through node 1553, line 1563, and node 1532.

During a memory operation, transistors 1520 and 1521 can respond to corresponding signals BIAS0 and BIAS1 and selectively couple line 370 or 371 to line 1541. Transistors 1522 and 1523 can respond to corresponding signals BIAS2 and BIAS3 and selectively couple line 372 or 373 to line 1542. Line 1541 and 1542 can be structured as conductive lines to carry the same signal SRC.

Signal SRC on lines 1541 and 1542 can be provided with different values (e.g., voltage value) at different times (e.g., at different memory operations). For example, signal SRC can be provided with voltages V0 and V1 in a read operation and a programming operation, respectively. Voltages V0 and V1 can have different values. For example, voltage V0 can have a value of zero volts (e.g., a reference voltage of zero volts). Voltage V1 can have a positive voltage value (e.g., a reference voltage of two volts).

During a read or programming operation, if line 370 or line 371 is an unselected line, or if both lines 370 and 371 are unselected lines, transistors 1520 and 1521 can operate to couple the unselected line (370 or line 371) or the unselected lines (370 and 371) to line 1541.

During a read or programming operation, if line 372 or line 373 is an unselected line, or if both lines 372 and 373 are unselected lines, transistors 1522 and 1523 can operate to couple the unselected line (372 or line 373) or the unselected lines (372 and 373) to line 1542.

If line 370, 371, 372, or line 373 is a selected line, bias circuit 1507 may not couple the selected to line 1541 or 1542. Thus, the signal (e.g., voltage) on the selected line may not have a value corresponding to voltage V0 or V1. In a read operation, the signal on the selected line may have a value based on the value of a selected memory cell of the selected memory cell string associated with the selected line. In a programming operation, the signal on the selected line may have a value based on the value of information to be written into the selected memory cell.

Coupling the unselected line, as described above, to voltage V0 or voltage V1 may improve memory operations of memory device, such as may reduce undesired coupling capacitance (e.g., parasitic capacitance) between adjacent lines during the memory operations. For example, if line 370 is a selected line and line 371 is an unselected line, a coupling capacitance between lines 370 and 371 may be reduced if line 371 is coupled to voltage V0 (e.g., during a read operation) or to voltage V1 (e.g., during a programming read operation).

Figure 16:
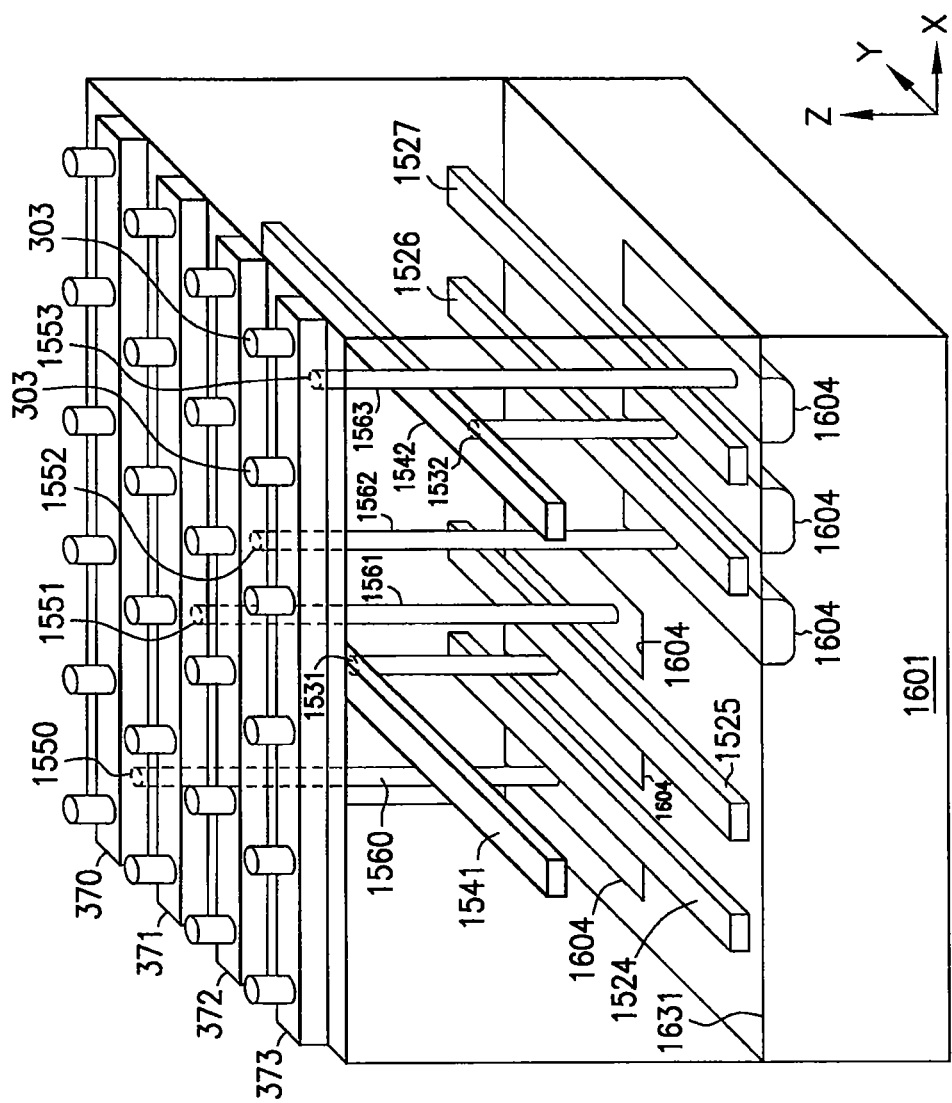
FIG. 16 shows 3-D views of a structure of a portion of the memory device of FIG. 15, according to an embodiment of the invention.

FIG. 16 shows 3-D views of a structure of a portion of memory device 1500 of FIG. 15, according to an embodiment of the invention. For simplicity, FIG. 16 omits memory cell strings 302 (FIG. 15) coupled to lines 370, 371, 372, and 373 at connections 303.

As shown in FIG. 16, lines 370 and 371 can be located between substrate 1601 and memory cell strings 302 (not shown in FIG. 16) that are coupled to lines 370, 371, 372, and 373 at connections 303 in FIG. 16.

Substrate 1601 can include doped regions 1604, which can form sources and drains of transistors 1520, 1521, 1522, and 1523 (FIG. 15). Substrate 1601 and doped regions 1604 can include materials similar to or identical to those of substrate 401 and doped regions 504, respectively, of FIG. 5.

As shown in FIG. 16, four of doped regions 1604 can be coupled to respective lines 370, 371, 372, and 373 through lines 1560, 1561, 1562, and 1563, respectively. Each of lines 1560, 1561, 1562, and 1563 has a length in the Z-direction. One of the doped regions 1604 coupled to node 1531 and line 1541 can be shared (e.g., as a common drain or source) by transistors 1520 and 1521. Another one of the doped regions 1604 coupled to node 1532 and line 1542 can be shared (e.g., as a common drain or source) by transistors 1522 and 1523.

Gates 1524, 1525, 1526, and 1527 can be located in the same device level between lines 370, 371, 372, and 373, and a surface 1631 of substrate 1601, such that gates 1524, 1525, 1526, and 1527 can be located in a device level below another device level where lines 370, 371, 372, and 373 are located and above surface 1631.

Lines 1541 and 1542 can be located in the same device level between lines 370, 371, 372, and 373 and gates 1526 and 1527, such that lines 1541 and 1542 can be located in a device level below another device level where lines 370, 371, 372, and 373 are located and above a device level where gates 1526 and 1527 are located.

Figure 17:
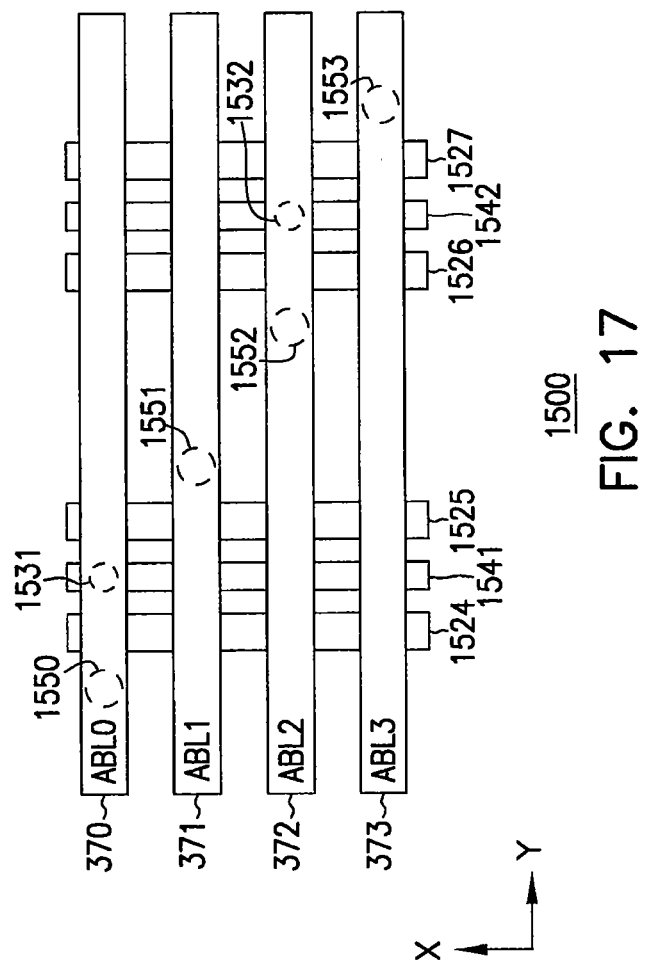
FIG. 17 shows a top view of the structure of the memory device of FIG. 16, according to an embodiment of the invention.

FIG. 17 shows a top view of the structure of memory device 1500 of FIG. 16, according to an embodiment of the invention. As shown in FIG. 17, each of gates 1524, 1525, 1526, and 1527 has a length in the X-direction. Each of lines 1541 and 1542 also has length in the X-direction. Gates 1524, 1525, 1526, and 1527, and lines 1541 and 1542 can include conductive material, such as polysilicon, metal, or other conductive material.

Figure 18:
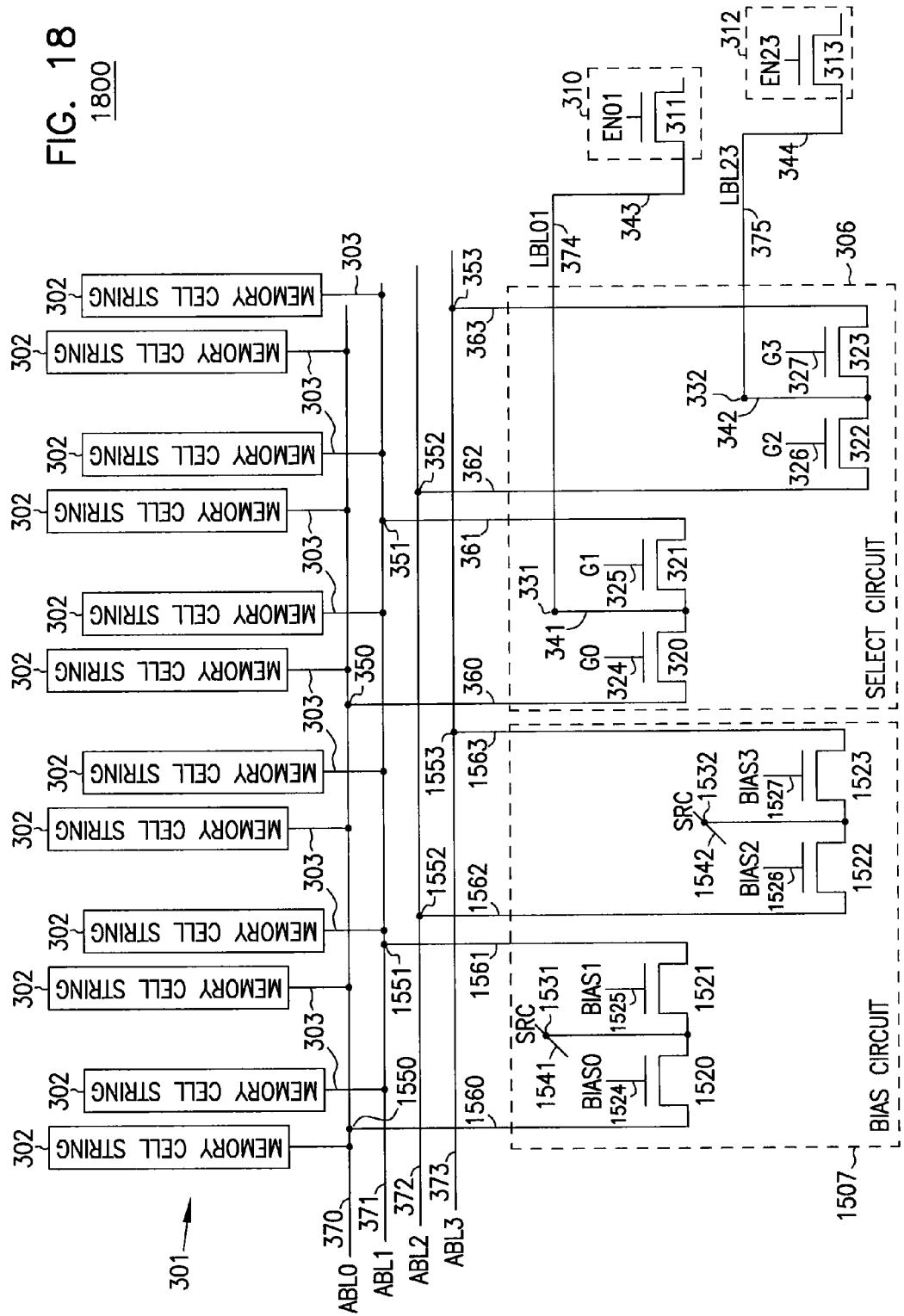
FIG. 18 shows a schematic diagram of a portion of another memory device including a memory array, a select circuit, and a bias circuit, according to an embodiment of the invention.

FIG. 18 shows a schematic diagram of a portion of a memory device 1800 including memory array 301, select circuit 306, and bias circuit 1507, according to an embodiment of the invention. Memory device 1800 can include a combination of some components from memory device 300 (FIG. 3) and memory device 1500 (FIG. 15), such as memory array 301, select circuit 306, bias circuit 1507, and sense amplifiers 310 and 312, described above with reference to FIG. 3 through FIG. 6B and FIG. 15 through FIG. 17. Thus, detailed description of similar or identical components between memory devices 300, 1500, and 1800 is not repeated here.

As shown in FIG. 18, select circuit 306 and bias circuit 1507 can be coupled to the same lines 370, 371, 372, and 373 associated with memory cell strings 302 of memory array 301. The operations of select circuit 306, bias circuit 1507, and sense amplifiers 310 and 312 are described above with reference to FIG. 3 through FIG. 6B and FIG. 15 through FIG. 17.

Figure 19:
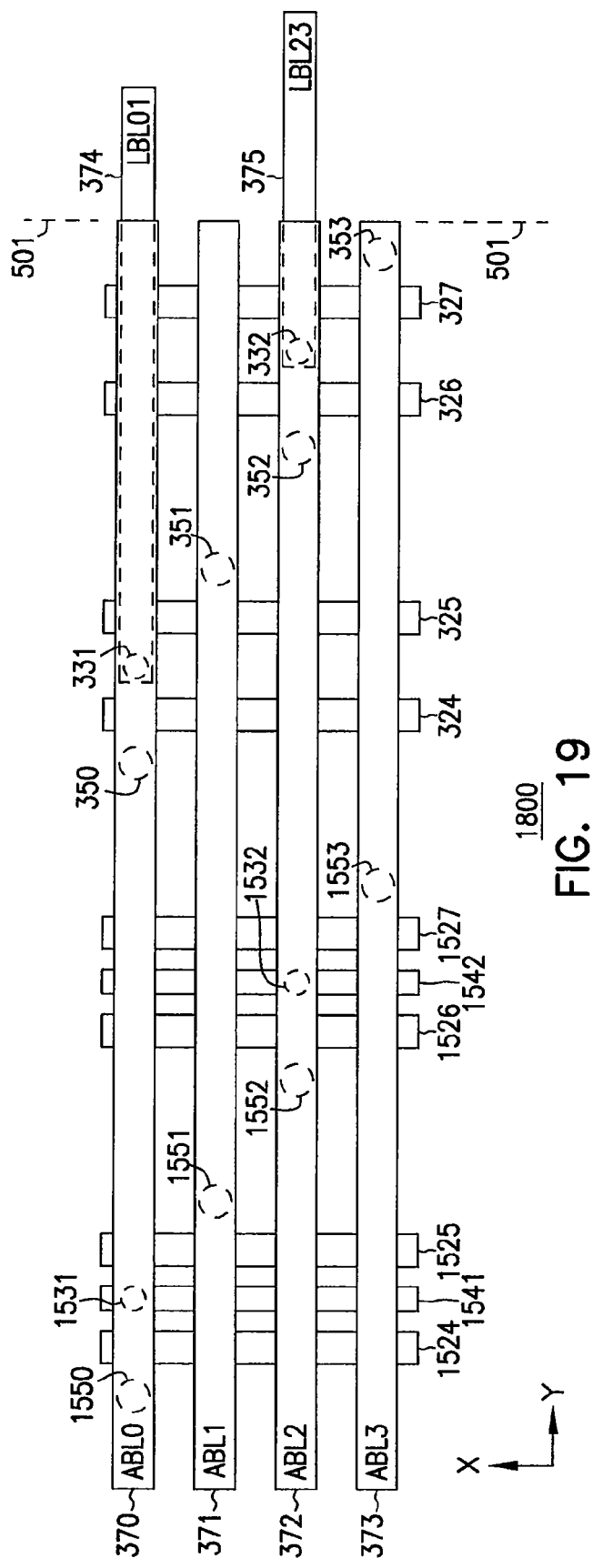
FIG. 19 shows a top view of the structure of the memory device of FIG. 18, according to an embodiment of the invention.

FIG. 19 shows a top view of the structure of memory device 1800 of FIG. 18, according to an embodiment of the invention. For simplicity, detailed description of the same elements between FIG. 3 through FIG. 6B, FIG. 15 through FIG. 19 is not repeated in the description of FIG. 19.

As shown in FIG. 19, each of lines 370, 371, 372, and 373 can have two nodes coupled to it from below, one from select circuit 306 and another one from bias circuit 1507. For example, line 370 has nodes 350 and 1550 coupled to it. In another example, line 373 has nodes 353 and 1553 coupled to it.

Figure 20:
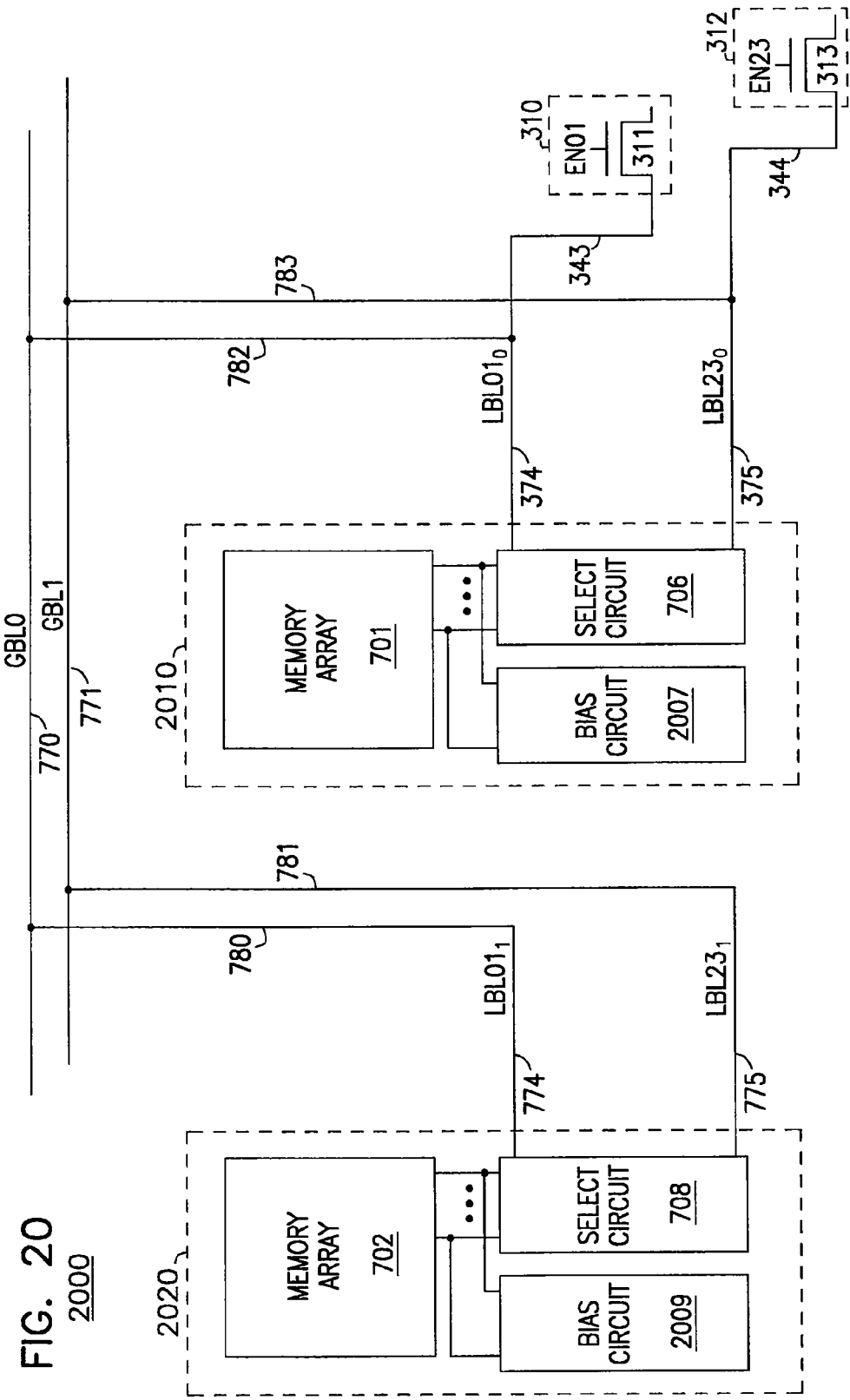
FIG. 20 shows a schematic diagram of a portion of a memory device including multiple memory arrays, select circuits, and bias circuits, according to an embodiment of the invention.

FIG. 20 shows a schematic diagram of a portion of a memory device 2000 including memory arrays 701 and 702, select circuits 706 and 708, and bias circuits 2007 and 2009, according to an embodiment of the invention. Memory device 2000 can include components similar to or identical to those of memory device 700 of FIG. 7A and FIG. 8, such as memory arrays 701 and 702, select circuits 706 and 708, sense amplifiers 310 and 312, and lines associated with these components. Thus, detailed description of similar or identical components between memory devices 700 and 2000 is not repeated here.

As shown in FIG. 20, memory device 2000 can include a device portion 2010, where memory array 701, select circuit 706, and bias circuit 2007 can be included (e.g., physically located), and a device portion 2020, where memory array 702, select circuit 708, and bias circuit 2009 can be included (e.g., physically located).

As described above with reference to FIG. 7A, each of arrays 701 and 702 can include memory array 301 of FIG. 3 described above with reference to FIG. 3 through FIG. 6B.

Each of select circuits 706 and 708 can include select circuit 306 described above with reference to FIG. 3 through FIG. 6B.

In FIG. 20, each of bias circuit 2007 and 2009 can include bias circuit 1507 described above with reference to FIG. 15 through FIG. 19.

Figure 21:
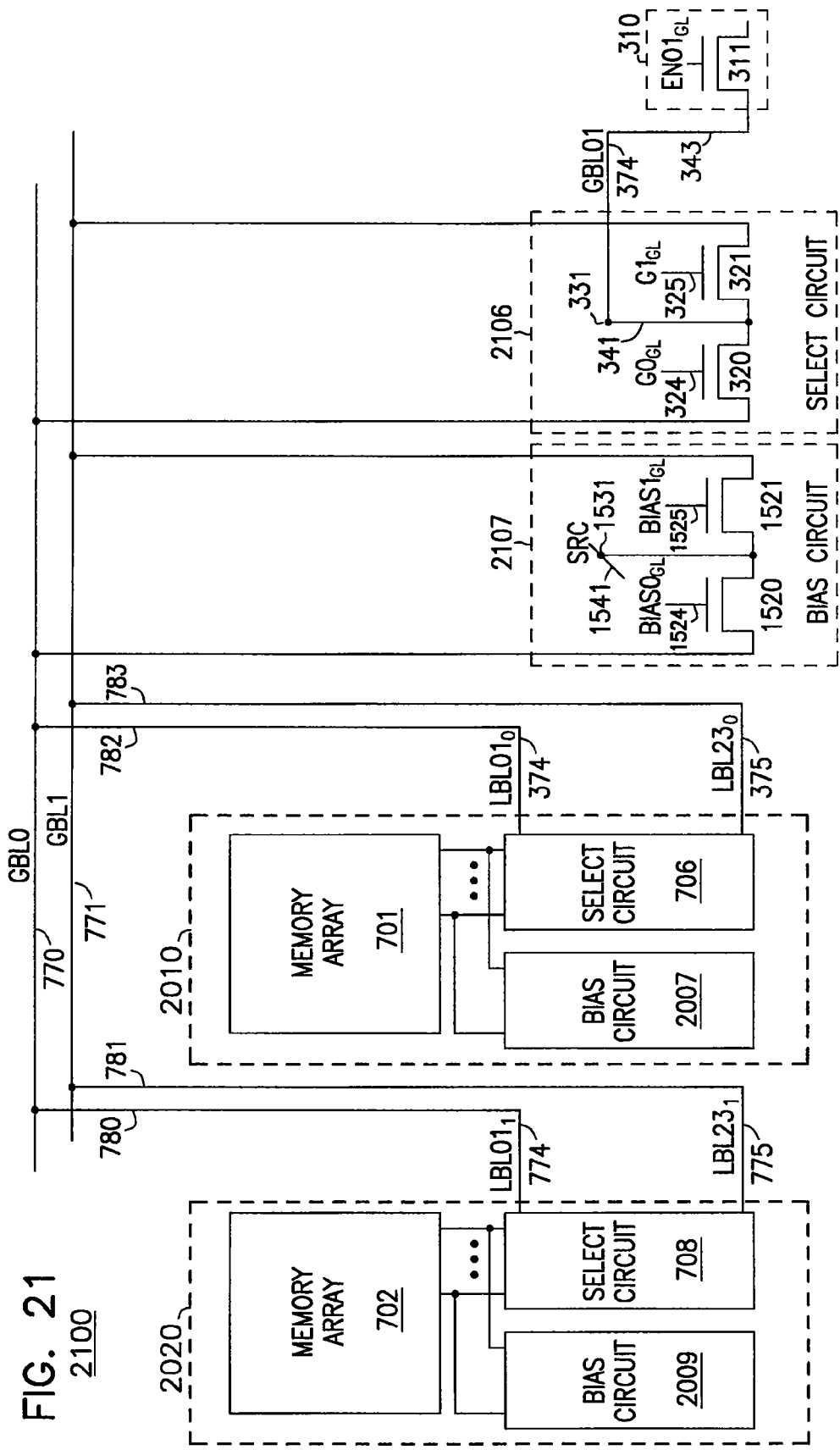
FIG. 21 shows a schematic diagram of a portion of a memory device including global data lines, a select circuit, and a bias circuit, according to an embodiment of the invention.

The connections between memory array 701 and select circuit 706 and bias circuit 2007 in FIG. 21 can be similar to or identical to those of memory array 301 and select circuit 306 and bias circuit 1507 of FIG. 18 and FIG. 19.

Lines 770 and 771 of memory device 2000 can have structure and arrangement similar to or identical to those of lines 770 and 771 of memory device 700 shown in FIG. 8.

Memory device 2000 can include a single die (e.g., silicon die) where device portions 2010 and 2020 can be located in different areas of the same single die. Alternatively, memory device 2000 can include dice that are separated from each other and device portion 2010 can be located in one of the dice and device portion 2020 can located in another one of the dice.

FIG. 21 shows a schematic diagram of a portion of a memory device 2100 including lines (e.g., global data lines) 770 and 771, select circuit 2106, and bias circuit 2107, according to an embodiment of the invention. Memory device 2100 can include components similar to or identical to those of memory device 2000 of FIG. 20, such as device portions 2010 and 2020 and associated lines. Thus, detailed description of similar or identical components between memory devices 2000 and 2100 is not repeated here.

As shown in FIG. 21, memory device 2100 can include select circuit 2106 in addition to select circuits 706 and 708. Select circuit 2106 can include components similar to or identical to those of select circuit 306 of FIG. 3, such as transistors 320 and 321 and associated connections including a connection coupled to sense amplifier 310. Detailed description of similar or identical components between select circuits 306 and 2106 is not repeated here.

As shown in FIG. 21, transistors 320 and 321 of select circuit 2106 can be coupled to lines 770 and 771, as shown in FIG. 21. Transistors 320 and 321 can form a multiplexer and respond to corresponding signals $G0_{GL}$ and $G1_{GL}$ to selectively couple line 770 or 771 to line 374 during a memory operation (e.g., a read operation).

Signal GBL01 on line 374 can correspond to either signal GBL0 on line 770 or signal GBL1 on line 771. Transistor 311 of sense amplifier 310 can respond to signal $EN01_{GL}$ to enable sense amplifier 310 to sense signal GBL01 and determine corresponding values of the stored information. Sense amplifier 310 may provide the values (e.g., in the form of signals) to other components of memory device 2100 (e.g., an I/O circuit, such as I/O circuit 117 of FIG. 1) for further processing.

As shown in FIG. 21, memory device 2100 can include bias circuit 2107 in addition to bias circuits 2007 and 2009. Bias circuit 2107 can include components similar to or identical to those of bias circuit 1507 of FIG. 15, such as transistors 1520 and 1521 and associated connections including a connection coupled to line 1541. Detailed description of similar or identical components between bias circuits 1507 and 2107 is not repeated here.

As shown in FIG. 21, transistors 1520 and 1521 of bias circuit 2107 can be coupled to lines 770 and 771. Transistors 1520 and 1521 can respond to corresponding signals $BIAS0_{GL}$ and $BIAS1_{GL}$ to selectively couple line 770 or 771 to line 1541 during a memory operation (e.g., a read or programming operation). As described above with reference to FIG. 15, line 1541 can have different voltages (e.g., voltages V0 and V1) in different memory operations (e.g., read and programming operations)

Lines 770 and 771 of memory device 2100 can have structure and arrangement similar to or identical to those of lines 770 and 771 of memory device 700 shown in FIG. 8.

Memory device 2100 can include a single die (e.g., silicon die) where device portions 2010 and 2020 can be located in different areas of the same single die. Alternatively, memory device 2100 can include dice that are separated from each other, and device portion 2010 can be located in one of the dice and device portion 2020 can located in another one of the dice.

Figure 22:
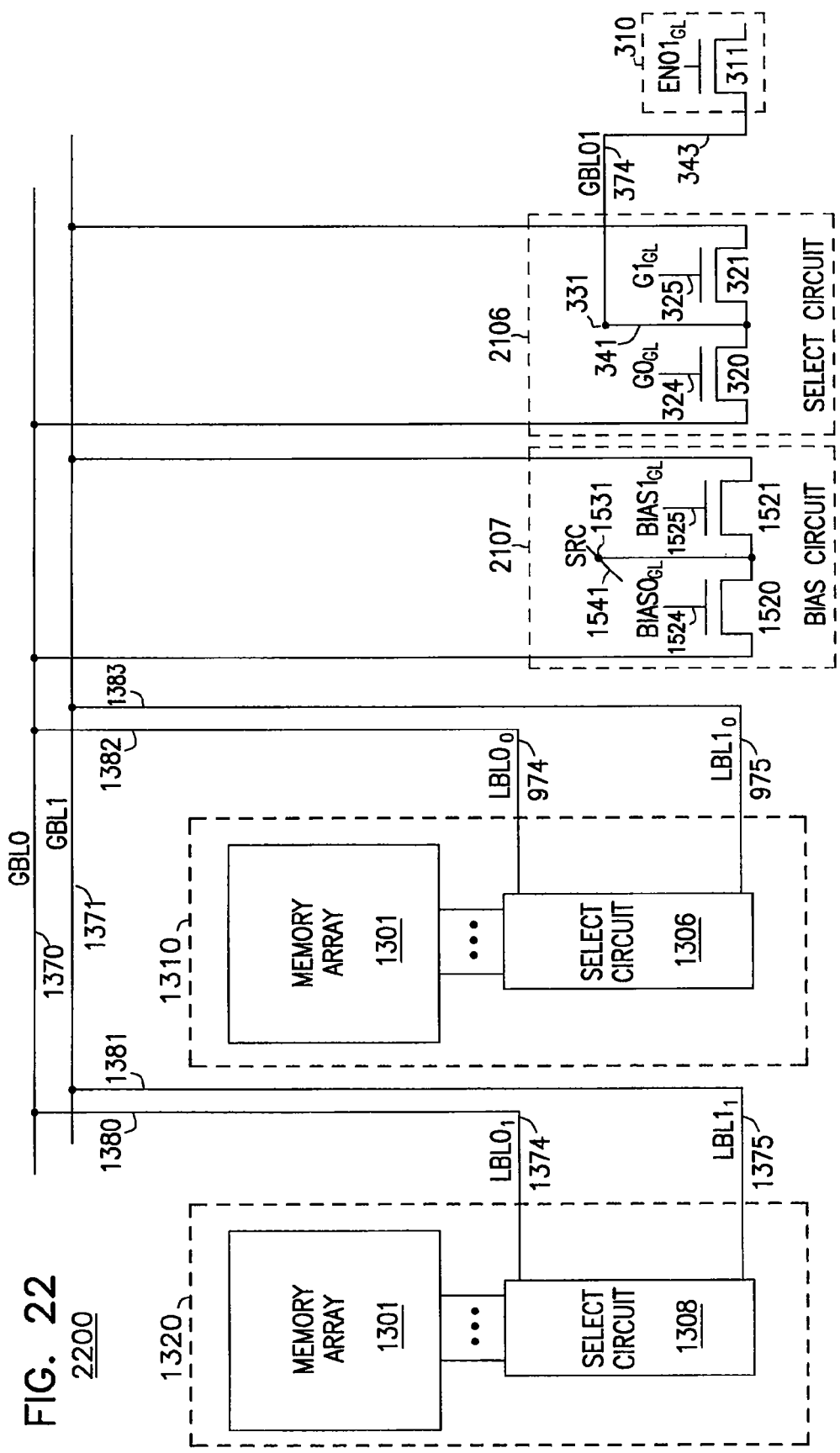
FIG. 22 shows a schematic diagram of a portion of another memory device including global data lines, a select circuit, and a bias circuit, according to an embodiment of the invention.

FIG. 22 shows a schematic diagram of a portion of a memory device 2200 including lines (e.g., global data lines) 1370 and 1371, select circuit 2106, and bias circuit 2107, according to an embodiment of the invention. Memory device 2200 can include components similar to or identical to the components of memory device 1300 (FIG. 13A and FIG. 14) and memory device 2100 (FIG. 21) described above. For example, device portions 1310 and 1320 and associated lines of memory device 2200 in FIG. 22 can be similar to or identical to those of memory device 1300 (FIG. 13A). Select circuit 2106 and bias circuit 2107 of memory device 2200 in FIG. 22 can be similar to or identical to those of memory device 2100 (FIG. 21). As shown in FIG. 22, each of device portions 1310 and 1320 can exclude (in other words, not including) a bias circuit, such as bias circuit 2007 or 2009 of FIG. 21. Detailed description of similar or identical components between memory devices 1300, 2100, and 2200 is not repeated here.

Lines 1370 and 1371 of memory device 2200 can have structure and arrangement similar to or identical to those of lines 1370 and 1371 of memory device 1300 shown in FIG. 14.

Memory device 2200 can include a single die (e.g., silicon die) where device portions 1310 and 1320 can be located in different areas of the same single die. Alternatively, memory device 2200 can include dice that are separated from each other, and device portion 1310 can be located in one of the dice and device portion 1320 can located in another one of the dice.

Figure 23:
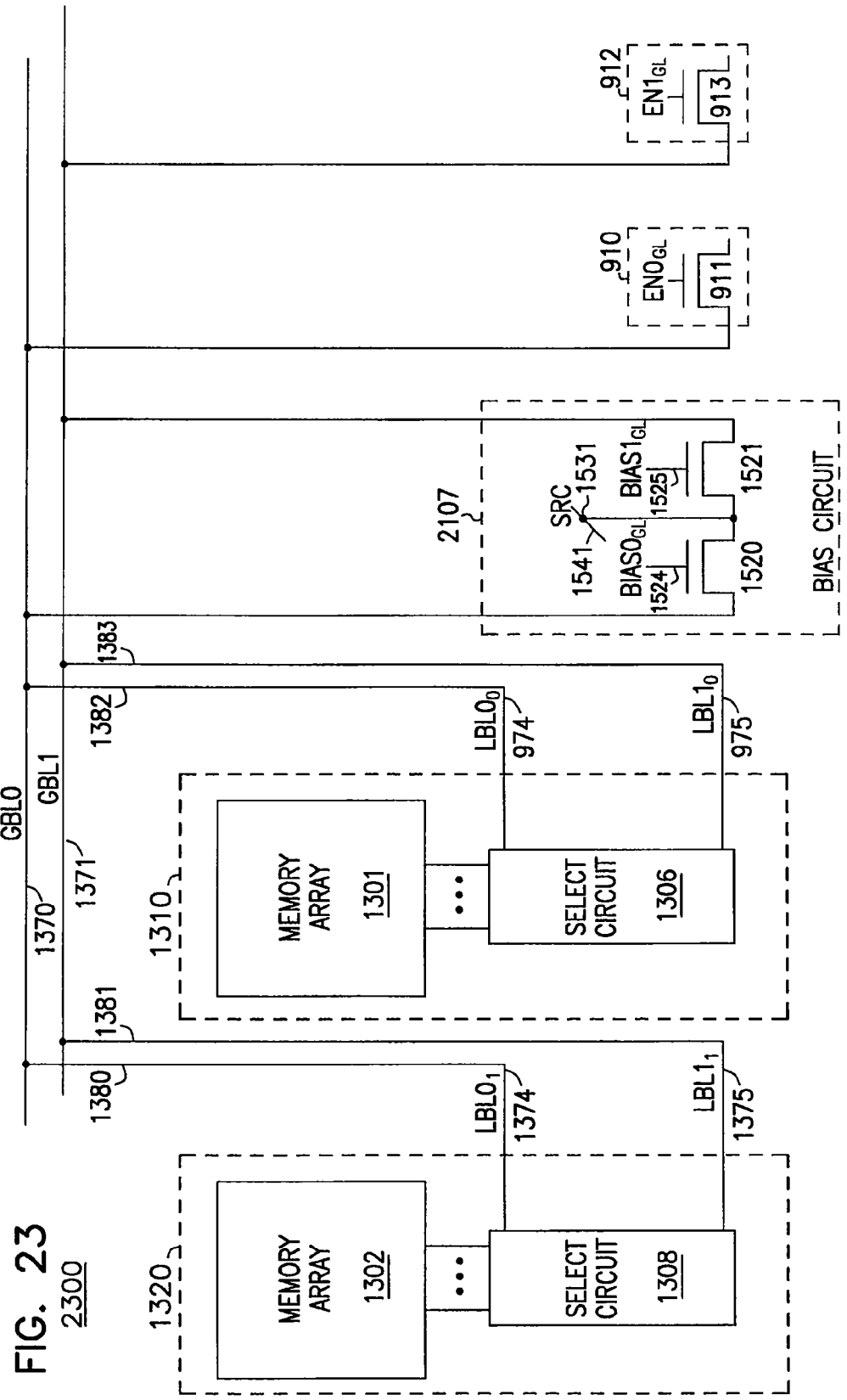
FIG. 23 shows a schematic diagram of a portion of another memory device including global data lines, a bias circuit, and sense amplifiers, according to an embodiment of the invention.

FIG. 23 shows a schematic diagram of a portion of a memory device 2300 including lines (e.g., global data lines) 1370 and 1371, bias circuit 2107, and sense amplifiers 910 and 912, according to an embodiment of the invention. Memory device 2300 can include components similar to or identical to the components of memory device 1300 (FIG. 13A and FIG. 14) and memory device 2200 (FIG. 21) described above. For example, device portions 1310 and 1320 and associated lines of memory device 2300 in FIG. 23 can be similar to or identical to those of memory device 1300 (FIG. 13A). Bias circuit 2107 of memory device 2300 in FIG. 23 can be similar to or identical to that of memory device 2200 (FIG. 22). As shown in FIG. 23, memory device 2200 can exclude a select circuit (e.g., select circuit 2106 in FIG. 22) coupled to lines 1370 and 1371. Detailed description of similar or identical components between memory devices 1300, 2200, and 2300 is not repeated here.

As shown in FIG. 23, sense amplifiers 910 and 912 can be coupled to lines 1370 and 1371, respectively. Transistors 911 and 913 can respond to corresponding signals $EN0_{GL}$ and $EN1_{GL}$ to enable sense amplifiers 910 and 912 to sense signals GBL0 and GBL1 and determine corresponding values of the stored information. Sense amplifiers 910 and 912 may provide the values (e.g., in the form of signals) to other components of memory device 2300 (e.g., an I/O circuit, such as I/O circuit 117 of FIG. 1) for further processing.

Lines 1370 and 1371 of memory device 2300 can have structure and arrangement similar to or identical to those of lines 1370 and 1371 of memory device 1300 shown in FIG. 14.

Memory device 2300 can include a single die (e.g., silicon die) where device portions 1310 and 1320 can be located in different areas of the same single die. Alternatively, memory device 2300 can include dice that are separated from each other, and device portion 1310 can be located in one of the dice and device portion 1320 can located in another one of the dice.

Figure 24:
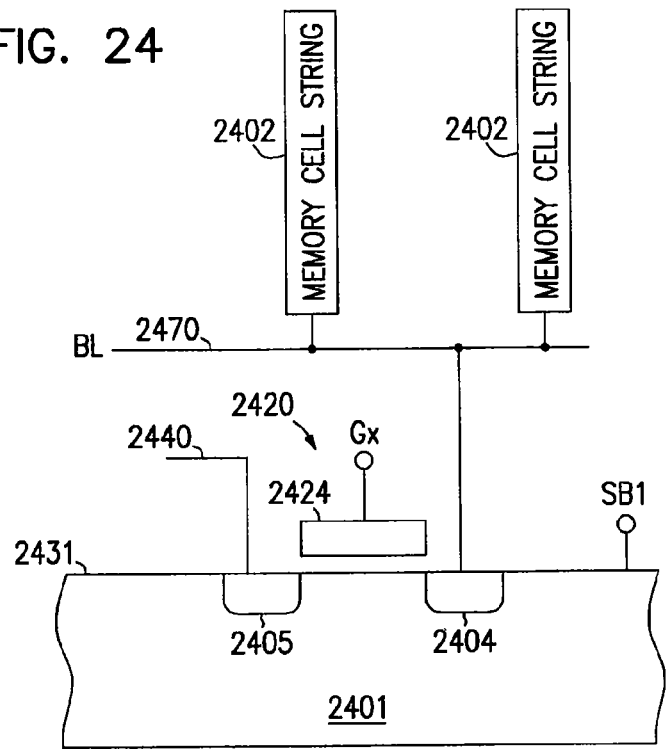
FIG. 24 shows a structure including a transistor located under a data line and memory cell strings, according to an embodiment of the invention.

FIG. 24 shows a structure including a transistor 2420 located under a line (e.g., data line) 2470 and memory cell strings 2402, according to an embodiment of the invention. The components in the structure shown in FIG. 24, including memory cell strings 2402, line 2470, transistor 2420, and substrate 2401, can be part of a memory device, such as any memory device described above with reference to FIG. 1 through FIG. 23.

For example, the components in FIG. 24 can correspond to memory cell strings 302, line 370, one of transistors 320 through 323, and substrate 401 of memory device 300, shown in FIG. 3 through FIG. 5. In another example, the components in FIG. 24 can correspond to memory cell strings 302, line 370, one of transistors 920 through 923, and substrate 1001 of memory device 900, shown in FIG. 9 through FIG. 11. In a further example, the components in FIG. 24 can correspond to memory cell strings 302, line 370, one of transistors 1520 through 1523, and substrate 1601 of memory device 900, shown in FIG. 15 and FIG. 16.

As shown in FIG. 24, transistor 2420 can include doped regions (e.g., source and drain) 2404 and 2405 formed in substrate 2401 and a gate 2424 formed above a surface 2431 of substrate 2401. Transistor 2420 and substrate 2401 can include material similar to or identical to those of substrate 401 and doped regions 404 of FIG. 4. For example, substrate 2401 can include p-type material (e.g., p-type doped-silicon) and doped regions 2404 and 2405 can include n-type material (n-type doped-silicon). In another example, substrate 2401 can include n-type material and doped regions 2404 and 2405 can include p-type material.

As shown in FIG. 24, doped regions 2404 and 2405 can be coupled to lines 2470 and 2440, respectively. Line 2470 can carry signal BL. Gate 2424 can carry signal Gx. Signal SB1 can be applied to substrate 2401. Line 2440 can have different voltage values during different operations (e.g., read, programming, and erase operations). For simplicity, specific voltage values for line 2440 are omitted from Table 1 below.

Table 1 shows example values of voltages associated with signals BL, Gx, and SB1 in the structure shown in FIG. 24 during read, programming, and erase operations.

TABLE 1

|  | Read | Programming | Erase |
| --- | --- | --- | --- |
| BL (line 2470 unselected) | V0 | V2 | Verase |
| BL (line 2470 selected) | $Vbl_{READ}$ | $Vbl_{PGRM}$ | Verase |
| Gx (line 2470 unselected) | Vg0 | Vg0 | Vg0 |
| Gx (line 2470 selected) | V3 | V4 | V0 |
| SB1 | V0 | V0 | V0 |

In Table 1, voltage V0 in Table 1 can have a value of zero volts.

Voltage V2 in Table 1 can have a value of approximately two volts.

Voltage Verase in Table 1 can correspond to a voltage having a value that can clear information stored in the memory cell strings 2402. For example, voltage Verase can have a value of approximately 20 volts.

Voltage $Vbl_{READ}$ in Table 1 can have a value that corresponds to information stored in a memory cell of one of selected memory cell strings 2402 (FIG. 24) during a read operation. For example, voltage $Vbl_{READ}$ can have a value between zero and five volts.

Voltage $Vbl_{PGRM}$ in Table 1 can have a value that corresponds to information to be stored into a memory cell of one of selected memory cell strings 2402 (FIG. 24) during a programming operation. For example, voltage $Vbl_{PGRM}$ can have a value of zero volts and two volts, corresponding values of "0" and "1" of a single bit, respectively, if memory cells of memory cell strings 2402 include single level cells. In another example, voltage $Vbl_{PGRM}$ can have a value between zero volts and six volts, corresponding values of multiple bits, if memory cells of memory cell strings 2402 include multi-level cells.

Voltage Vg0 in Table 1 can have a value that can turn off (or keep off) transistor 2420. For example, voltage Vg0 can have a value of zero volts.

Voltages V3 and V4 in Table 1 can have a value that can turn on transistor 2420. For example, V3 can have a value of approximately three volts. V4 can have a value of approximately four volts.

The operations and values of signals BL, Gx, and SB1 associated with the components of the structure shown in FIG. 24 can be applied to corresponding components of the memory devices (e.g., memory devices 300, 900, and 1500), described above with reference to FIG. 1 through FIG. 23.

Figure 25:
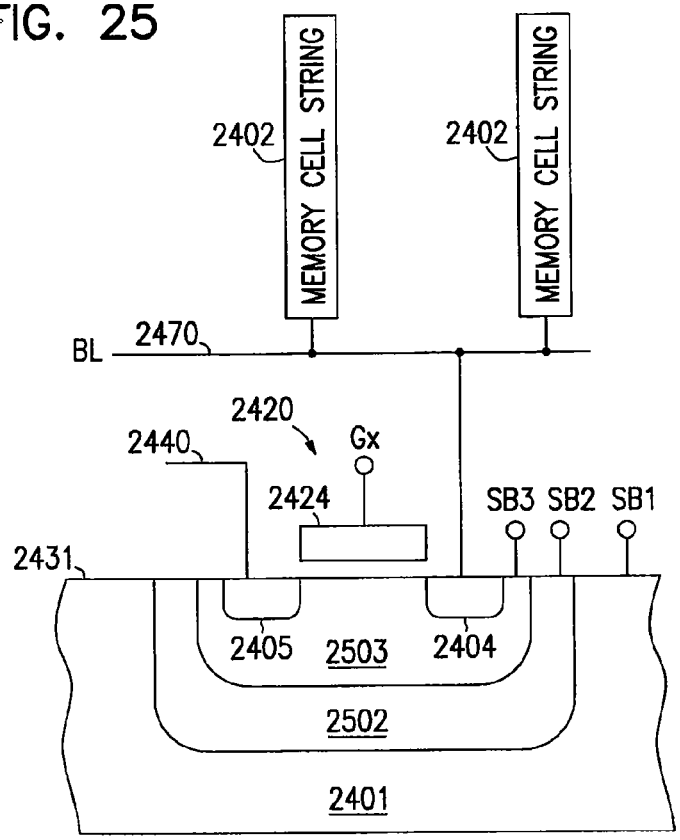
FIG. 25 shows another structure including a transistor located under a data line and memory cell strings, according to an embodiment of the invention.

FIG. 25 shows another structure including a transistor 2420 located under line 2470 and memory cell strings 2402, according to an embodiment of the invention. The structure shown in FIG. 25 can be variation of the structure shown in FIG. 24. Thus, the components and their operations in structure shown in FIG. 25 can be part of a memory device, such as any memory device described above with reference to FIG. 1 through FIG. 23.

In FIG. 24 and FIG. 25, similar or identical components are designated with the same labels, such as memory cell strings 2402, line 2470, transistor 2420, and substrate 2401, and associated signal BL, Gx, and SB1.

As shown in FIG. 25, substrate 2401 can include a region 2502 surrounding a region 2503 (e.g., well regions) where doped regions 2404 and 2405 are located in region 2503. Substrate 2401 and region 2503 can include materials of the same conductivity type (e.g., p-type doped-silicon) and region 2502 and doped regions 2404 and 2405 can include materials of the same conductivity type (n-type doped-silicon) that can be different from the conductivity type of substrate 2401 and region 2503.

Table 2 shows example values of voltages associated with signals BL, Gx, SB1, SB2, and SB3 in the structure shown in FIG. 25 during read, programming, and erase operations.

TABLE 2

|  | Read | Programming | Erase |
| --- | --- | --- | --- |
| BL (line 2470 unselected) | V0 | V2 | Verase |

TABLE 2-continued

|  | Read | Programming | Erase |
| --- | --- | --- | --- |
| BL (line 2470 selected) | $Vbl_{READ}$ | $Vbl_{PGRM}$ | Verase |
| Gx (line 2470 unselected) | Vg0 | Vg0 | Vg0 |
| Gx (line 2470 selected) | V3 | V4 | V5 |
| SB1 | V0 | V0 | V0 |
| SB2 | V0 | V0 | Verase |
| SB3 | V0 | V0 | Verase |

In Table 2, V0, V2, Verase, $Vbl_{READ}$, $Vbl_{PGRM}$, Vg0, V3, and V4 can have the same values as those in Table 1.

Voltage V5 in Table 1 can have a value approximately equal to that of voltage Verase. For example, voltage V5 can have a value of approximately 20 volts.

Figure 26:
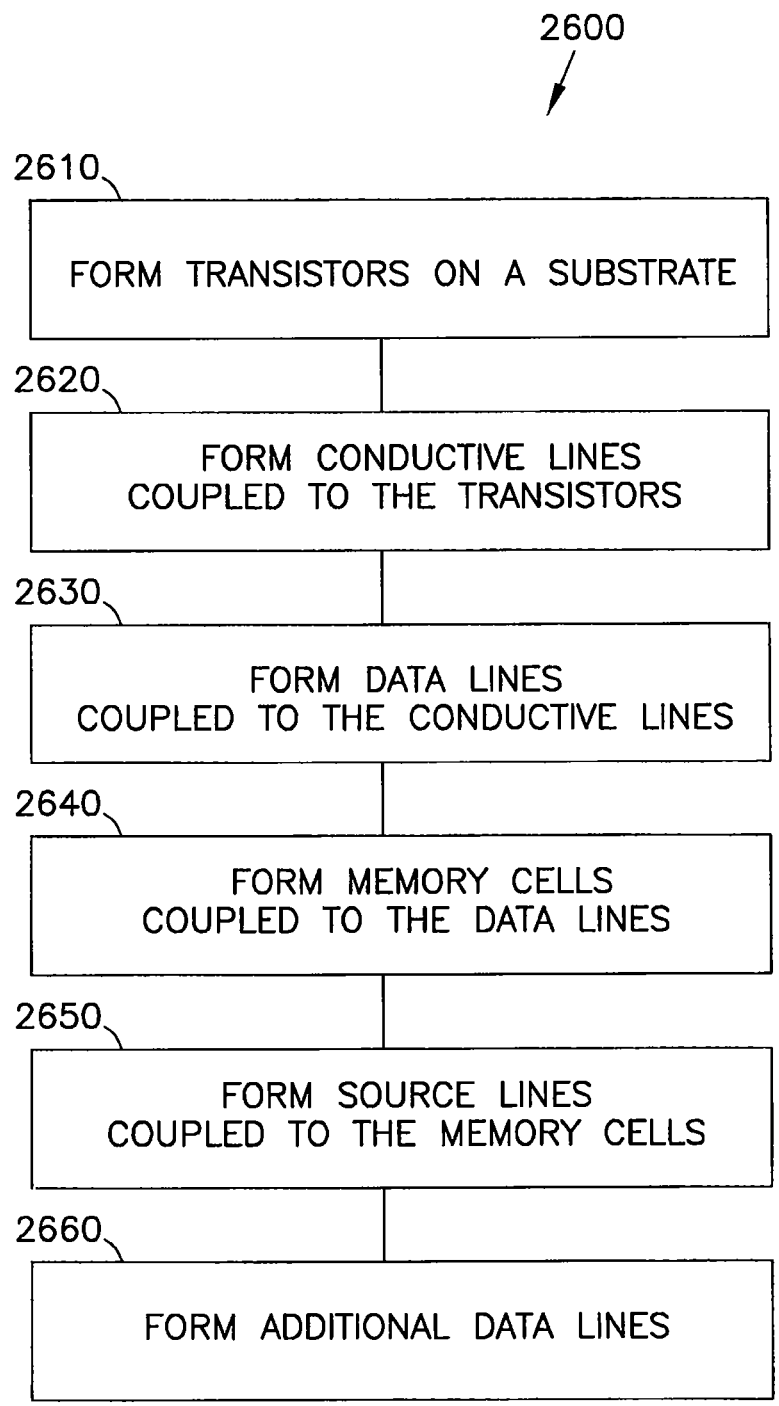
FIG. 26 is a flowchart showing a method, according to an embodiment of the invention.

FIG. 26 is a flowchart showing a method 2600, according to an embodiment of the invention. The memory device formed in method 2600 can include memory devices 100, 200, 300, 700, 900, 1300, 1500, 1800, 2000, 2100, 2200, and 2300 described above with reference to FIG. 1 through FIG. 25.

Activity 2610 of method 2600 can include forming at least a respective portion of transistors (e.g., transistors 320 through 323 in FIG. 3 through FIG. 5) in a substrate. Forming the transistors can include forming doped regions (e.g., source and drain) of the transistor in the substrate and forming a gate of the transistor overlying the substrate. Activity 2610 can form the gate after the doped regions are formed.

Activity 2620 of method 2600 can include forming conductive lines coupled to respectively doped regions of the transistors. Examples of the conductive lines formed in activity 2620 include lines 341 and 342 (FIG. 5 and FIG. 18), lines 940 through 943 (FIG. 9), lines coupled to nodes 1531 and 1532 and to lines 1541 and 1542 (FIG. 18), lines 360 through 363 (FIG. 5 and FIG. 18), lines 960 through 963 (FIG. 9), and lines 1560 through 1563 (FIG. 18).

The conductive lines formed in activity 2620 can have a length in a direction perpendicular to a surface of the substrate.

Activity 2620 can form the conductive lines at different times, one line (or a group of lines) after another line (or another group of lines). For example, activity 2620 can form one or more conductive line (e.g., lines 341 and 342 in FIG. 5 or a combination of lines 341 and 342 in FIG. 18, and lines coupled to nodes 1531 and 1532 and to lines 1541 and 1542 in FIG. 18) at one time and form one or more other conductive line (e.g., lines 360 through 363 in FIG. 5 or a combination of lines 360 through 363 in FIG. 18 and lines 1560 through 1563 in FIG. 18) at another time. In this example, activity 2620 can form conductive lines 341 and 342 before forming conductive lines 360 through 363 (FIG. 5 or FIG. 18).

Activity 2630 of method 2600 can include forming data lines (e.g., lines 374 and 375 and lines 370 through 371 in FIG. 5, FIG. 9, or FIG. 18) coupled to the conductive lines. Activity 2630 can form data lines 374 and 375 after forming one group of the conductive lines (e.g., lines 341 and 342 in FIG. 5) formed in activity 2620 and before forming another group of the conductive lines (e.g., lines 360 through 363 in FIG. 5) formed in activity 2620.

The data lines formed in activity 2630 can have a length in a direction perpendicular (or substantially perpendicular) to the length of the conductive lines formed in activity 2620, and parallel (or substantially parallel) to the surface of the substrate.

Activity 2630 can form the data lines at different times. For example, activity 2630 can form one or more data lines (e.g., line 347 and 375 in FIG. 5) at one time and form one more other data line (e.g., lines 370 through 373 FIG. 5) at another the time. Thus, activity 2630 can form one group of data lines (e.g., lines 370 through 373 FIG. 5) after the processes of forming another group of data lines (e.g., lines 374 and 375).

Activity 2640 of method 2600 can include forming memory cells (e.g., memory cells 210, 211, and 212 of FIG. 2B) coupled to the data lines. Activity 2640 can be performed after activities 2610, 2620, and 2630 are performed. Thus, the memory cells formed in activity 2640 can be formed after the transistor, the conductive lines, and the data lines are formed in activities 2610, 2620, and 2630, respectively. Therefore, a group of the data lines (e.g., 370 through 373 in FIG. 5) can be formed such that the group can be located between the memory cells and the transistor (or located between the memory cells and another group of data lines (e.g., lines 374 and 375 in FIG. 5)).

The memory cells formed in activity 2630 can be located in multiple device levels of the memory device formed by method 2600, such that activity 2640 can form one memory cell among the memory cells in one device level and form another memory cell among the memory cells in another device level. The memory cells can be formed in memory cell strings (e.g. string 202 in FIG. 2B or memory cell string 302 in FIG. 3), such that memory cells within the same memory cell string can be vertically aligned with each other (e.g., directly stacked over each other) over a substrate of the memory device.

Activity 2650 of method 2600 can include forming source lines (e.g., lines 288 in FIG. 2A and FIG. 2B) coupled to the memory cells. The source lines can be formed after the memory cells (in activity 2640) are formed. The source lines can have a length in a direction parallel (or substantially parallel) to the surface of the substrate. Activity 2650 can form the source lines at the same time.

Activity 2660 of method 2600 can include forming additional data lines (e.g., global data lines) coupled to the data lines formed in activity 2630. Examples of the additional data lines formed in activity 2660 include lines 770 and 771 in FIG. 8, or lines 1370 and 1371 in FIG. 14. The additional data lines can be located in one or more device level that is different from the device level (or device levels) where the data lines (in activity 2630) or the source lines (in activity 2650) are located. For example, the additional data lines can be formed such that the source lines can be located between the additional data lines and the memory cells.

Method 2600 may include additional activities that can form a memory device having components and structures similar to or identical to any of memory devices 100, 200, 300, 700, 900, 1300, 1500, 1800, 2000, 2100, 2200, and 2300, described above with reference to FIG. 1 through FIG. 25.

The illustrations of apparatus (e.g., memory devices 100, 200, 300, 333, 700, 777, 900, 999, 1300, 1333, 1500, 1800, 2000, 2100, 2200, and 2300) are intended to provide a general understanding of the structure of various embodiments and are not intended to provide a complete description of all the elements and features of apparatus that might make use of the structures described herein.

Any of the components described above with reference to FIG. 1 through FIG. 26 can be implemented in a number of ways, including simulation via software. Thus, apparatus (e.g., memory devices 100, 200, 300, 333, 700, 777, 900, 999, 1300, 1333, 1500, 1800, 2000, 2100, 2200, and 2300) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100, 200, 300, 333, 700, 777, 900, 999, 1300, 1333, 1500, 1800, 2000, 2100, 2200, and 2300) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 300, 333, 700, 777, 900, 999, 1300, 1333, 1500, 1800, 2000, 2100, 2200, and 2300 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatus may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 26 include apparatus and methods having memory cells located in different device levels of a device, at least a portion of a transistor located in a substrate of the device, and a data line coupled to the transistor and the memory cells. The data line can be located between the transistor and the memory cells. Other embodiments including additional apparatus and methods are described. Such apparatus and methods described herein may reduce interconnections among components of a device, such as memory devices 100, 200, 300, 333, 700, 777, 900, 999, 1300, 1333, 1500, 1800, 2000, 2100, 2200, and 2300.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A device comprising:
a first memory array located over a substrate;
first data lines located between the substrate and the first memory array;
a second memory array located over the substrate;
second data lines located between the substrate and the second memory array;
additional data lines located over the first and second memory arrays;
a first circuit to selectively couple first memory cells of the first memory array to the additional data lines through at least a portion of the first data lines; and
a second circuit to selectively couple second memory cells of the second memory array to the additional data lines through at least a portion of the second data lines, wherein at least a portion of each of the first and second circuit is located in the substrate.

2. The device of claim 1, wherein the additional data lines include global data lines associated with the first and second memory arrays.

3. The device of claim 2, wherein the first data lines include local data lines associated with the first memory array.

4. The device of claim 2, wherein the second data lines include local data lines associated with the second memory array.

5. The device of claim 1, further comprising array data lines associated with the first memory cells, and the first circuit is configured to selectively couple the array data lines to the first data lines.

6. The device of claim 5, wherein the array data lines are located between the first data lines and the first memory cells.

7. The device of claim 1, further comprising array data lines associated with the second memory cells, and the second circuit is configured to selectively couple the array data lines to the second data lines.

8. The device of claim 7, wherein the array data lines are located between the second data lines and the second memory cells.

9. A device comprising:
a first memory array including a first memory cell string;
a first transistor including at least a portion located in a substrate of the device;
a first data line coupled to the first transistor and the first memory cell string, the first data line located between the first transistor and the first memory cell string;
a first additional data line coupled to the first transistor, the first additional data line located between the first transistor and the first data line;
a second memory array including a second memory cell string;
a second transistor including at least a portion located in the substrate;
a second data line coupled to the second transistor and the second memory cell string, the second data line located between the second transistor and the second memory cell string;
a second additional data line coupled to the second transistor, the second additional data line located between the second transistor and the second data line; and
a third additional data line coupled to the first and second additional data lines, wherein the first memory cell string is located between the first data line and the third additional data line.

10. The device of claim 9, wherein the second memory cell string is located between the second data line and the third additional data line.

11. The device of claim 9, wherein the first data line includes an array data line associated with the first memory array.

12. The device of claim 9, wherein the second data line includes an array data line associated with the second memory array.

13. The device of claim 9, wherein the first additional data line includes a local data line associated with the first memory array.

14. The device of claim 9, wherein the second additional data line includes a local data line associated with the second memory array.

15. The device of claim 9, wherein the third additional data line includes a global data line associated with the first and second memory arrays.

16. A method comprising:
forming a first circuit and a second circuit such that at least a portion of each of the first and second circuit is located in a substrate;
forming first data lines over the first circuit;
forming first a memory array over the first data lines;
forming second data lines over the second circuit;
forming a second memory array over the second data lines; and
forming additional data lines over the first and second memory arrays, such that at least one of the additional data lines is coupled to one of the first data lines and one of the second data lines.

17. The method of claim 16, wherein forming the first circuit includes forming a transistor such that a first node of the transistor is coupled to one of the first data lines.

18. The method of claim 17, wherein forming the second circuit includes forming an additional transistor such that a first node of the additional transistor is coupled to one of the second data lines.

19. The method of claim 16, further comprising:
forming array data lines over the first data lines such that the array data lines are between first data lines and the first memory array.

20. The method of claim 19, wherein forming the first circuit includes forming a transistor such that a first node of the transistor is coupled to one of the first data lines and a second node of the transistor is coupled to one of the array data lines.

21. The method of claim 20, further comprising:
forming additional array data lines over the second data lines such that the additional array data lines are between second data lines and second memory array.

22. The method of claim 21, wherein forming the second circuit includes forming an additional transistor such that a first node of the additional transistor is coupled to one of the second data lines and a second node of the additional transistor is coupled to one of the additional array data lines.

\* \* \* \* \*